(12) United States Patent
Shibazaki

(10) Patent No.: US 8,279,399 B2
(45) Date of Patent: Oct. 2, 2012

(54) EXPOSURE APPARATUS, EXPOSURE METHOD, AND DEVICE MANUFACTURING METHOD

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 1017 days.

(21) Appl. No.: 12/254,547

(22) Filed: Oct. 20, 2008

(65) Prior Publication Data

US 2009/0128790 A1   May 21, 2009

Related U.S. Application Data

(60) Provisional application No. 60/960,948, filed on Oct. 22, 2007.

(51) Int. Cl.
*G03B 27/42* (2006.01)
*G03B 27/58* (2006.01)

(52) U.S. Cl. ............................... 355/53; 355/72

(58) Field of Classification Search .................. 355/53, 355/72, 77
See application file for complete search history.

(56) References Cited

U.S. PATENT DOCUMENTS

| | | | |
|---|---|---|---|
| 4,780,617 A | 10/1988 | Umatate et al. | |
| 5,448,332 A | 9/1995 | Sakakibara et al. | |
| 6,208,407 B1 | 3/2001 | Loopstra | |
| 6,611,316 B2 | 8/2003 | Sewell | |
| 6,778,257 B2 | 8/2004 | Bleeker et al. | |
| 6,879,377 B2 * | 4/2005 | Jacobs et al. | 355/53 |
| 6,952,253 B2 | 10/2005 | Lof et al. | |
| 7,023,610 B2 | 4/2006 | Ohtsuki et al. | |
| 7,161,659 B2 | 1/2007 | Van Den Brink et al. | |
| 7,307,692 B2 | 12/2007 | Korenaga et al. | |
| 7,310,132 B2 | 12/2007 | Van Der Schoot et al. | |
| 2003/0025890 A1 | 2/2003 | Nishinaga | |
| 2005/0219486 A1 * | 10/2005 | Korenaga et al. | 355/53 |
| 2005/0248856 A1 | 11/2005 | Omura et al. | |
| 2005/0280791 A1 | 12/2005 | Nagasaka et al. | |
| 2006/0114445 A1 | 6/2006 | Ebihara | |
| 2006/0227308 A1 | 10/2006 | Brink et al. | |

(Continued)

FOREIGN PATENT DOCUMENTS

| | | |
|---|---|---|
| EP | 1 420 298 A2 | 5/2004 |
| EP | 1 713 113 A1 | 10/2006 |
| EP | 1 806 772 A1 | 7/2007 |
| JP | A-2007-281308 | 10/2007 |

(Continued)

OTHER PUBLICATIONS

Apr. 27, 2010 Written Opinion issued in International Application No. PCT/JP2008/069397.

*Primary Examiner* — Peter B Kim
(74) *Attorney, Agent, or Firm* — Oliff & Berridge, PLC

(57) ABSTRACT

When a transition is performed from a state where one wafer stage is positioned in an area including a liquid immersion area to a state where the other wafer stage is positioned in the area including the liquid immersion area, eaves sections arranged in both wafer stages are to be engaged to make a proximity or a contact state in the X-axis direction, and both stages are simultaneously driven in the X-axis direction while maintaining the state. In this manner, the liquid immersion area moves back and forth between the two stages via the eaves sections. This can restrain leakage of the liquid via a gap between both wafer stages, and further, a liquid leakage to the reflection surfaces arranged on the side surface of both wafer stages can be restrained. Further, interference between the reflection surfaces arranged in both wafer stages can be avoided.

81 Claims, 13 Drawing Sheets

U.S. PATENT DOCUMENTS

| | | |
|---|---|---|
| 2006/0227309 A1 | 10/2006 | Loopstra et al. |
| 2006/0231206 A1 | 10/2006 | Nagasaka et al. |
| 2007/0127006 A1 | 6/2007 | Shibazaki |
| 2007/0211235 A1 | 9/2007 | Shibazaki |
| 2007/0216881 A1 | 9/2007 | Van Der Schoot et al. |
| 2008/0008843 A1 | 1/2008 | Ratel |
| 2008/0088843 A1 | 4/2008 | Shibazaki |
| 2008/0111978 A1 | 5/2008 | Shibuta |
| 2008/0158531 A1 | 7/2008 | Kiuchi |
| 2008/0259297 A1* | 10/2008 | Kawakubo ................. 355/52 |
| 2009/0066923 A1 | 3/2009 | Shibuta |

FOREIGN PATENT DOCUMENTS

| | | |
|---|---|---|
| JP | A-2008-281308 | 10/2007 |
| JP | A-2008-124219 | 5/2008 |
| JP | A-2008-130745 | 6/2008 |
| WO | WO 2004/090577 A2 | 10/2004 |
| WO | WO 2005/059617 A2 | 6/2005 |
| WO | WO 2005/059618 A2 | 6/2005 |
| WO | WO 2006126569 A1 * | 11/2006 |
| WO | WO 2007/097379 A1 | 8/2007 |
| WO | WO 2008/059916 A1 | 5/2008 |

* cited by examiner

EXPOSURE APPARATUS, EXPOSURE METHOD, AND DEVICE MANUFACTURING METHOD

CROSS-REFERENCE TO RELATED APPLICATIONS

This non-provisional application claims the benefit of Provisional Application No. 60/960,948 filed Oct. 22, 2007, the disclosure of which is hereby incorporated herein by reference in its entirety.

BACKGROUND OF THE INVENTION

1. Field of the Invention

The present invention relates to exposure apparatus, exposure methods, and device manufacturing methods, and more particularly to an exposure apparatus and an exposure method used in a lithography process to manufacture microdevices such as a semiconductor device, and a device manufacturing method using the exposure method.

2. Description of the Background Art

Conventionally, in a lithography process for manufacturing electron devices (microdevices) such as semiconductor devices (such as integrated circuits) and liquid crystal display devices, a projection exposure apparatus by a step-and-repeat method (a so-called stepper), a projection exposure apparatus by a step-and-scan method (a so-called scanning stepper (which is also called a scanner) or the like are mainly used.

In this type of exposure apparatus, attempts have been made for a shorter wavelength of exposure light and an increase (a higher NA) in the numerical aperture of the projection optical system, in order to improve the resolution of the projection optical system. However, by the shorter wavelength of exposure light and a higher NA in the projection optical system, the depth of focus has become small. Therefore, as a method of substantially shortening the exposure wavelength and also increasing (widening) the depth of focus when compared with the depth of focus in the air, the exposure that uses the liquid immersion method has recently begun to gather attention.

Meanwhile, as well as high resolution, the exposure apparatus is also required to have a high throughput. As an approach for improving the throughput, various proposals are made also on a twin wafer stage type exposure apparatus which employs a method where a plurality of wafer stages holding a wafer, such as for example, two wafer stages, are arranged, and concurrent processing of different operations is performed on the two stages.

Furthermore, recently, a proposal has also been made on a twin wafer stage type exposure apparatus which employs a liquid immersion method (e.g. refer to U.S. Pat. No. 7,161,659).

Now, in the case of measuring a position (height) of the wafer stage in a Z-axis direction orthogonal to an XY plane, a Z interferometer is known (e.g. refer to U.S. Pat. No. 6,208,407) which measures the height of the wafer stage by arranging a reflection surface (a Z measurement reflection surface) tilted by a predetermined angle, such as for example, 45 degrees with respect to the XY plane on the side surface of the wafer stage, irradiating a measurement beam parallel to the XY plane on the reflection surface, and receiving the return beam.

However, in the case of employing the Z interferometer above in the exposure apparatus similar to the one described in, for example, the U.S. Pat. No. 7,161,659, it is desirable to configure both wafer stages so that the height measurement can be performed with the Z interferometer from both sides. However, in the case of such a configuration, when the two wafer stages are made to be in contact or in proximity and a liquid immersion area is passed between the two wafer stages as disclosed in the U.S. Pat. No. 6,208,407, there was the risk of the Z measurement reflection surfaces coming into contact and being damaged. Further, in order to prevent such a situation from occurring, when the two wafer stages try to pass the liquid immersion area in a state where the two wafer stages are spaced apart, the liquid may leak from between the stages, which is likely to make the passing of the liquid immersion area impractical. Further, the liquid that has leaked could wet the Z measurement reflection surface. Further, even in the case where the Z measurement reflection surface is not used, or in the case when at least one of the wafer stages has a mechanism section protruding more than the other sections, a problem similar to the description above could occur when the two wafer stages are made to be in contact or in proximity and the liquid immersion area (liquid) is passed between the two wafer stages.

SUMMARY OF THE INVENTION

According to a first aspect of the present invention, there is provided a first exposure apparatus that exposes an object with an energy beam via an optical system and a liquid, the apparatus comprising: a first movable body on which the object can be mounted, and is movable substantially along a predetermined plane within an area of a predetermined range which includes a first area including a liquid immersion area to which the liquid is supplied right below the optical system and a second area positioned on one side of a first direction of the first area; a second movable body on which the object can be mounted, and is movable independent from the first movable body substantially along the predetermined plane within an area including the first area and the second area; and a delivery portion arranged in at least one of the first and second movable bodies protruding on one side of a second direction perpendicular to the first direction within the predetermined plane, and having a width in the first direction wider than the liquid immersion area.

According to this apparatus, the first and second movable bodies are made to come into contact or move into proximity via a delivery portion, or delivery portions. And the first and second movable bodies are moved in the second direction while having maintained the contact or proximity state of the first and second movable bodies, and the liquid immersion area is passed over a delivery portion, or the liquid immersion area is sequentially passed over a delivery portion of both movable bodies. This makes it possible to pass the liquid immersion area from over one of the movable bodies to the other movable body, without leaking the liquid from between the first and second movable bodies. Accordingly, operations such as the total recovery of the liquid in the immersion area and supplying the liquid again are no longer necessary, and it becomes possible to pass the liquid immersion area from over one of the movable bodies to the other movable body in a state where the first and second movable bodies are spaced apart by a distance corresponding to the length of the delivery portion in the second direction.

According to a second aspect of the present invention, there is provided a second exposure apparatus that exposes an object with an energy beam via an optical system and a liquid, the apparatus comprising: a first movable body on which the object can be mounted, and is movable substantially along a predetermined plane within an area of a predetermined range which includes a first area including a liquid immersion area to which the liquid is supplied right below the optical system and a second area positioned on one side of a first direction of the first area; a second movable body on which the object can be mounted, and is movable independent from the first movable body substantially along the predetermined plane within an area including the first area and the second area; and a movable body drive system which drives the first and second movable bodies simultaneously in the second direction while maintaining a scrum state, in which the first movable body and the second movable body are shifted in the first direction via a predetermined offset amount and are also in proximity or in contact in a second direction perpendicular to the first direction within the predetermined plane via a part of the surfaces facing each other, when a transition is performed from a first state where at least one of the movable bodies of the first and second movable bodies is positioned in the first area to a second state where the other movable body is positioned in the first area.

According to this apparatus, the movable body drive system simultaneously drives the first movable body and the second movable body in the second direction, while maintaining a scrum state in which the first movable body and the second movable body are shifted in the first direction by a predetermined offset amount and are also in proximity or in contact in a second direction via a part of the surfaces facing each other. This makes it possible to pass the liquid immersion area from over one of the movable bodies to the other movable body, without leaking the liquid from between the first and second movable bodies. Accordingly, operations such as the total recovery of the liquid in the immersion area and supplying the liquid again are no longer necessary, and it becomes possible to pass the liquid immersion area from over one of the movable bodies to the other movable body in a state where the first movable body and the second movable body are shifted only by a predetermined offset amount in the first direction. The offset amount can be decided taking into consideration the efficiency of the operation before and after passing over the liquid immersion area, or it can be established taking into consideration the shape of the first movable body and the second movable body.

According to a third aspect of the present invention, there is provided a first exposure method in which an object is exposed with an energy beam via an optical system and a liquid, the method comprising: a transition process in which by driving a first movable body and a second movable body, on which the object can be mounted and are independently movable within an area of a predetermined range which includes a first area including a liquid immersion area to which the liquid is supplied directly below the optical system and a second area positioned on one side of a first direction of the first area, simultaneously in a second direction, while maintaining a scrum state in which the first movable body and the second movable body move into proximity or come into contact in the second direction perpendicular to the first direction within the predetermined plane via a delivery portion, the liquid immersion area is transferred from one of the first and second movable bodies to the other, via the delivery portion, and a transition from a first state in which the one movable body is positioned in the first area to a second state in which the other movable body is positioned in the first area is performed.

According to this method, it becomes possible to pass the liquid immersion area from over one of the movable bodies to the other movable body, without leaking the liquid from between the first and second movable bodies. Accordingly, operations such as the total recovery of the liquid in the immersion area and supplying the liquid again will no longer be necessary. Further, it becomes possible to pass the liquid immersion area from over one of the movable bodies to the other movable body in a state where the first and second movable bodies are spaced apart by a distance corresponding to the length of the delivery portion in the second direction.

According to a fourth aspect of the present invention, there is provided a second exposure method in which an object is exposed with an energy beam via an optical system and a liquid, the method comprising: a transition process in which by simultaneously driving a first movable body and a second movable body, on which the object can be mounted and are independently movable within an area of a predetermined range which includes a first area including a liquid immersion area to which the liquid is supplied directly below the optical system and a second area positioned on one side of a first direction of the first area, in a second direction while maintaining a scrum state in which the first movable body and the second movable body are shifted in the first direction via a predetermined offset amount and are also in proximity or in contact in a second direction perpendicular to the first direction within the predetermined plane via a part of the surfaces facing each other, a transition is performed from a first state where at least one of the movable bodies of the first and second movable bodies is positioned in the first area to a second state where the other movable body is positioned in the first area.

According to this method, it becomes possible to pass the liquid immersion area from over one of the movable bodies to the other movable body, without leaking the liquid from between the first and second movable bodies. Accordingly, operations such as the total recovery of the liquid in the immersion area and supplying the liquid again are no longer necessary, and it becomes possible to pass the liquid immersion area from over one of the movable bodies to the other movable body in a state where the first movable body and the second movable body are shifted only by a predetermined offset amount in the first direction. The offset amount can be decided taking into consideration the efficiency of the operation before and after passing over the liquid immersion area, or it can be established taking into consideration the shape of the first movable body and the second movable body.

According to a fifth aspect of the present invention, there is provided a device manufacturing method including a lithography process in which the object is exposed by the exposure method according to one of the first and second exposure methods of the present invention.

BRIEF DESCRIPTION OF THE DRAWINGS

In the accompanying drawings.

DESCRIPTION OF THE EMBODIMENTS

An embodiment of the present invention will be described below, with reference to FIGS. 1 to 11.

Figure 1:
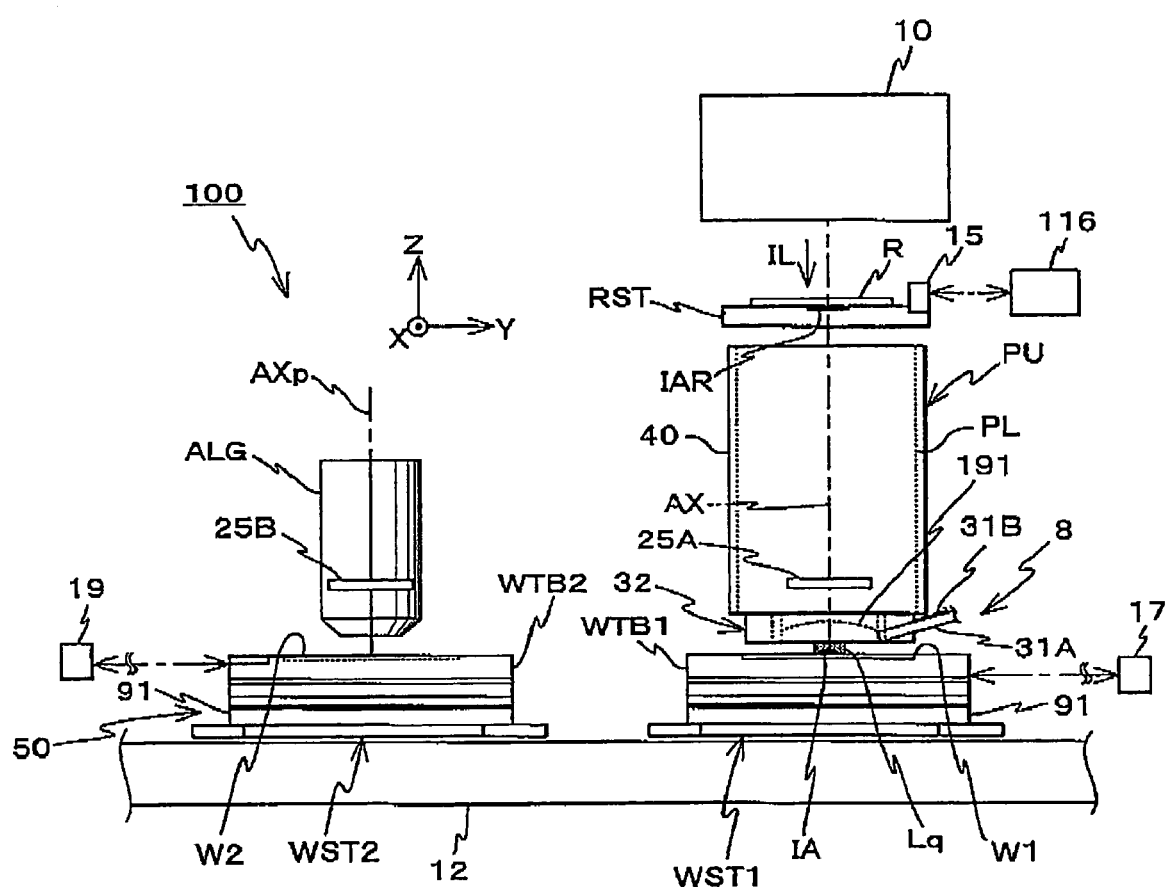
FIG. 1 is a view that schematically shows a configuration of an exposure apparatus of an embodiment.

FIG. 1 schematically shows a configuration of a twin stage type exposure apparatus 100 in an embodiment. Exposure apparatus 100 is a projection exposure apparatus by the step-and-scan method, or a so-called scanner. As discussed below, in the embodiment, a projection optical system PL and an alignment system ALG are arranged, and in the description below, a direction parallel to an optical axis AX of projection optical system PL will be described as a Z-axis direction, a direction parallel to a straight line connecting the center of projection optical system PL (optical axis AX) and a detection center of alignment system ALG (an optical axis AXp) within a plane orthogonal to the Z-axis direction will be described as a Y-axis direction, a direction orthogonal to the Z-axis and the Y-axis will be described as an X-axis direction, and rotational (tilt) directions around the X-axis, the Y-axis, and the Z-axis will be described as a $\theta x$ direction, a $\theta y$ direction, and a $\theta z$ direction, respectively.

Exposure apparatus 100 is equipped with an illumination system 10, a reticle stage RST, a projection unit PU, a local liquid immersion device 8, an alignment system ALG, a stage device 50, and a control system of these sections and the like. Incidentally, in FIG. 1, two wafer stages WST1 and WST2, which configure stage unit 50, are located below projection unit PU and below alignment system ALG, respectively. Further, on wafer stages WST1 and WST2, wafers W1 and W2 are placed, respectively.

Illumination system 10 has a light source, an illuminance uniformity optical system including an optical integrator and the like, and an illumination optical system including a reticle blind and the like (none of which are shown), as is disclosed in, for example, U.S. Patent Application Publication No. 2003/025890 and the like. Illumination system 10 illuminates a slit-shaped illumination area IAR which is set on reticle R with a reticle blind (also referred to as a masking system) by illumination light (exposure light) IL with a substantially uniform illuminance. In this case, as illumination light IL, for example, an ArF excimer laser beam (wavelength 193 nm) is used.

On reticle stage RST, reticle R on which a circuit pattern or the like is formed on its pattern surface (the lower surface in FIG. 1) is fixed, for example, by vacuum chucking. Reticle stage RST is finely drivable within an XY plane by a reticle stage drive section 11 (not shown in FIG. 1, refer to FIG. 7) including a linear motor or the like, and reticle stage RST is also drivable in a scanning direction (in this case, the Y-axis direction, which is the lateral direction of the page surface in FIG. 1) at a predetermined scanning speed.

The positional information (including rotation information in the $\theta z$ direction) of reticle stage RST in the XY plane (a movement plane) is constantly detected, for example, at a resolution of around 0.25 nm by a reticle laser interferometer (hereinafter referred to as a "reticle interferometer") 116, via a movable mirror 15 (in actuality, a Y movable mirror (or a retro reflector) that has a reflection surface which is orthogonal to the Y-axis direction and an X movable mirror that has a reflection surface orthogonal to the X-axis direction are arranged). The positional information from reticle interferometer 116 is sent to a main controller 20 (not shown in FIG. 1, refer to FIG. 7). Main controller 20 controls the position (and speed) of reticle stage RST via reticle stage drive system 11, based on the positional information that has been sent.

Projection unit PU is placed below (−Z-direction) reticle stage RST in FIG. 1. Projection unit PU includes a barrel 40, and projection optical system PL held within barrel 40. As projection optical system PL, for example, a dioptric system is used, consisting of a plurality of lenses (lens elements) that is disposed along optical axis AX, which is parallel to the Z-axis direction. Projection optical system PL is, for example, a both-side telecentric dioptric system that has a predetermined projection magnification (such as one-quarter, one-fifth, or one-eighth times). Therefore, when illumination system 10 illuminates illumination area IAR on reticle R with illumination area IL, by illumination light IL which has passed through reticle R placed so that its pattern surface substantially coincides with a first surface (object surface) of projection optical system PL, a reduced image of the circuit pattern of reticle R within illumination area IAR via projection optical system PL (projection unit PU) is formed on an area (hereinafter also referred to as an exposure area) IA conjugate with illumination area IAR on a wafer W1 (or W2) whose surface is coated with a resist (a sensitive agent) and is placed on a second surface (image plane surface) side of projection optical system PL. And, in accordance with the synchronous drive of reticle stage RST and wafer stage WST1 (or WST2), by reticle R being moved relatively in the scanning direction (the Y-axis direction) with respect to illumination area IAR (illumination light IL) while wafer W1 (or W2) is moved relatively in the scanning direction (the Y-axis direction with respect to the exposure area (illumination light IL), scanning exposure of a shot area (divided are) on wafer W1 (or W2) is performed, and the pattern of reticle is transferred onto the shot area. That is, in the embodiment, a pattern is generated on wafer W1 (or W2) according to illumination system 10, reticle R, and projection optical system PL, and then by the exposure of the sensitive layer (resist layer) on wafer W1 (or W2) with illumination light IL, the pattern is formed on wafer W.

In exposure apparatus 100 of the embodiment, a local liquid immersion device 8 is installed to perform exposure by a liquid immersion method. Local liquid immersion device 8 includes a liquid supply device 5, a liquid recovery device 6 (both of which are not shown in FIG. 1, refer to FIG. 7), a liquid supply pipe 31A, a liquid recovery pipe 31B, a nozzle unit 32 and the like. As shown in FIG. 1, nozzle unit 32 is supported in a suspended state by a mainframe (not shown) holding projection unit PU, so that the periphery of the lower end portion of barrel 40 that holds an optical element closest to the image plane side (wafer side) constituting projection optical system PL, in this case, a lens (hereinafter also referred to as a tip lens) 191, is enclosed. In the embodiment, as shown in FIG. 1, the lower end surface of nozzle unit 32 is set to be on a substantially flush surface with the lower end surface of tip lens 191.

Figure 7:
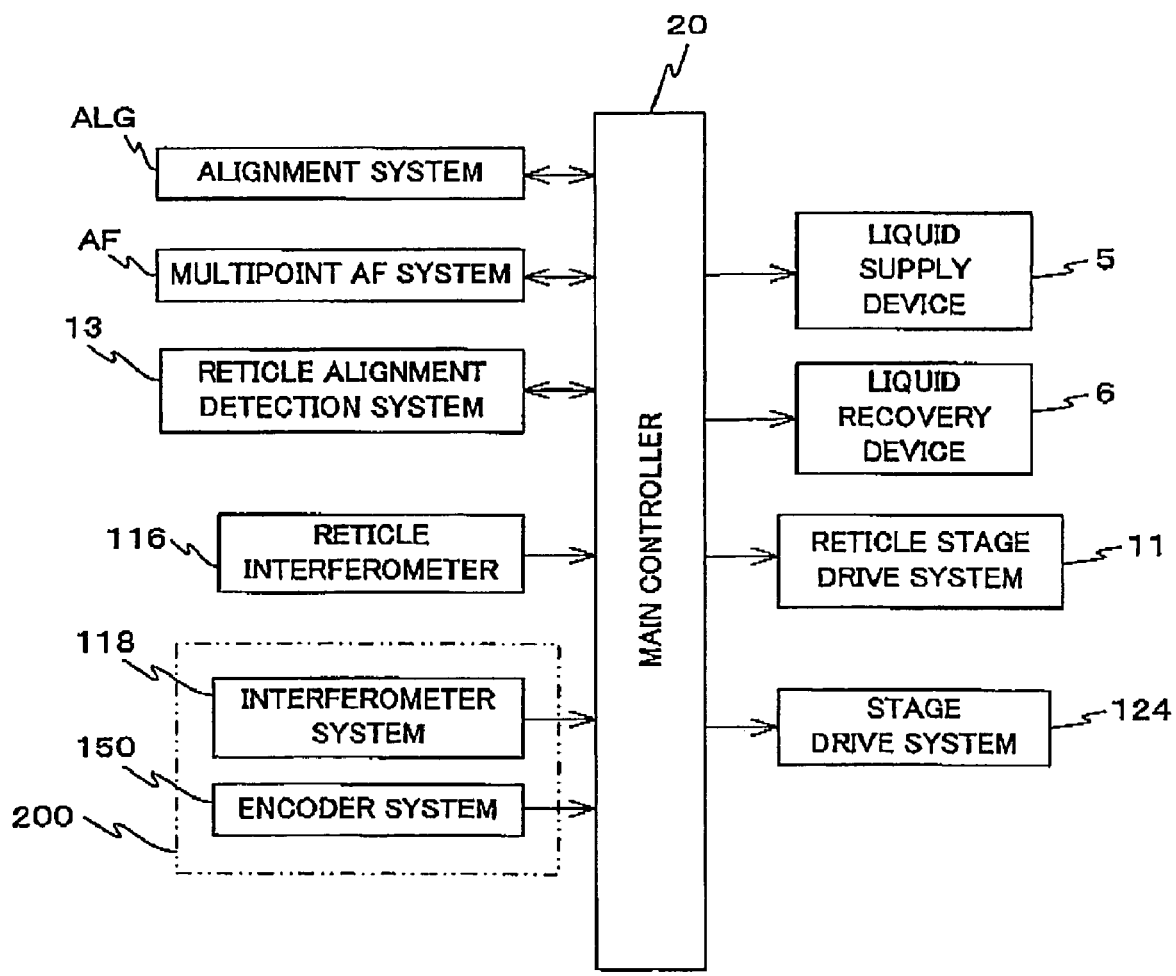
FIG. 7 is a block diagram showing a main configuration of a control system of an exposure apparatus in an embodiment.

Liquid supply pipe 31A connects to liquid supply device 5 (not shown in FIG. 1, refer to FIG. 7), and liquid recovery pipe 31B connects to liquid recovery device 6 (not shown in FIG. 1, refer to FIG. 7). In this case, liquid supply device 5 is equipped with a tank to store the liquid, a compression pump, a temperature controller, a valve for controlling the flow amount of the liquid, and the like. Liquid recovery device 6 is equipped with a tank to store the liquid which has been recovered, a suction pump, a valve for controlling the flow amount of the liquid, and the like.

Main controller 20 controls liquid supply device 5 (refer to FIG. 7) and supplies liquid Lq between tip lens 191 and wafer W1 (or W2) via liquid supply pipe 31A, and also controls liquid recovery device 6 (refer to FIG. 7) and recovers liquid from between tip lens 191 and the wafer via liquid recovery pipe 31B. During the operations, main controller 20 controls liquid supply device 5 and liquid recovery device 6 so that the quantity of liquid supplied constantly equals the quantity of liquid which has been recovered. Accordingly, in the space between tip lens 191 and the wafer, a constant quantity of liquid Lq is held constantly replaced, and by this, a liquid immersion area 14 (refer to FIG. 5) is formed. In exposure apparatus 100 of the embodiment, by irradiating illumination light IL on the wafer via liquid Lq forming liquid immersion area 14, exposure of the wafer is performed. Although liquid immersion area 14 herein is a three-dimensional space filled with liquid Lq which should be referred to as a liquid space, because space also means a gap, the term liquid immersion area is used in order to avoid such misunderstanding in the specification.

As the liquid above, for example, pure water which transmits the ArF excimer laser beam (light with a wavelength of 193 nm) is used. Incidentally, refractive index n of the water with respect to the ArF excimer laser beam is around 1.44, and in the pure water, the wavelength of illumination light IL is 193 nm×1/n, shorted to around 134 nm.

Alignment system ALG is placed at a position a predetermined distance away on the −Y side from the center (optical axis AX (coinciding with the center of exposure area IA previously described in the embodiment) of projection optical system PL) of projection unit, and is fixed to the mainframe (not shown). As alignment system ALG, for example, an FIA (Field Image Alignment) system by an image processing method is used. On wafer alignment and the like, responding to instructions from main controller 20, alignment system ALG picks up an image of a reference mark on wafer stage WST1 or WST2 or an alignment mark (wafer mark) on the wafer, and supplies the imaging signals to main controller 20 via a signal processing system (not shown) (refer to FIG. 7).

In addition, in exposure apparatus 100 in the embodiment, a multiple point focal point position detection system (hereinafter shortly referred to as a multipoint AF system) AF (not shown in FIG. 1, refer to FIG. 7) having a similar configuration as the one disclosed in, for example, U.S. Pat. No. 5,448,332 and the like, is arranged in the vicinity of projection unit PU. As multipoint AF system herein, a system is used having a configuration of a detection beam from an irradiation system being irradiated on a plurality of detection points on the wafer W1 (or W2) surface via a light transmitting section (not shown) formed in nozzle unit 32 previously described and liquid Lq of the liquid immersion area, and each of the reflected lights of the detection beams at the plurality of detection points being received by a light receiving system via a different light transmitting section formed in nozzle unit 32. Detection signals of multipoint AF system AF are supplied to main controller 20 (refer to FIG. 7) via an AF signal processing system (not shown). Main controller 20 detects positional information of the wafer W surface in the Z-axis direction based on the detection signals of multipoint AF system AF, and performs a so-called focus leveling control of wafer W during the scanning exposure based on the detection results. Incidentally, multipoint AF system can be arranged in the vicinity of alignment system ALG and surface position information (unevenness information) of the wafer surface can be obtained beforehand at the time of wafer alignment, and at the time of exposure, the surface position information and measurement values of a different sensor detecting a position of the wafer stage upper surface in the Z-axis direction can be used to perform the so-called focus leveling control of wafer W.

Furthermore, in exposure apparatus 100, above reticle stage RST, a reticle alignment detection system 13 (not shown in FIG. 1, refer to FIG. 7) consisting of a pair of TTR (Through The Reticle) alignment systems which use light of the exposure wavelength is arranged. Detection signals of reticle alignment detection system 13 are supplied to main controller 20 (refer to FIG. 7) via an alignment signal processing system (not shown).

Stage device 50, as shown in FIG. 1, is equipped with wafer stages WST1 and WST2 placed above a base board 12, a measurement system 200 (refer to FIG. 7) including an interferometer system 118 that measures positional information of wafer stages WST1 and WST2, and a stage drive system 124 (refer to FIG. 7) which drives wafer stages WST1 and WST2 and the like. Wafer stages WST1 and WST2 are supported by levitation above base board 12 via a clearance of several μm by air sliders which will be described later that each stage has. And, by a planar motor described below configuring stage drive system 124, wafer stages WST1 and WST2 are each drivable within the XY plane along the upper surface (movement guide surface) of base board 12.

Figure 2A:
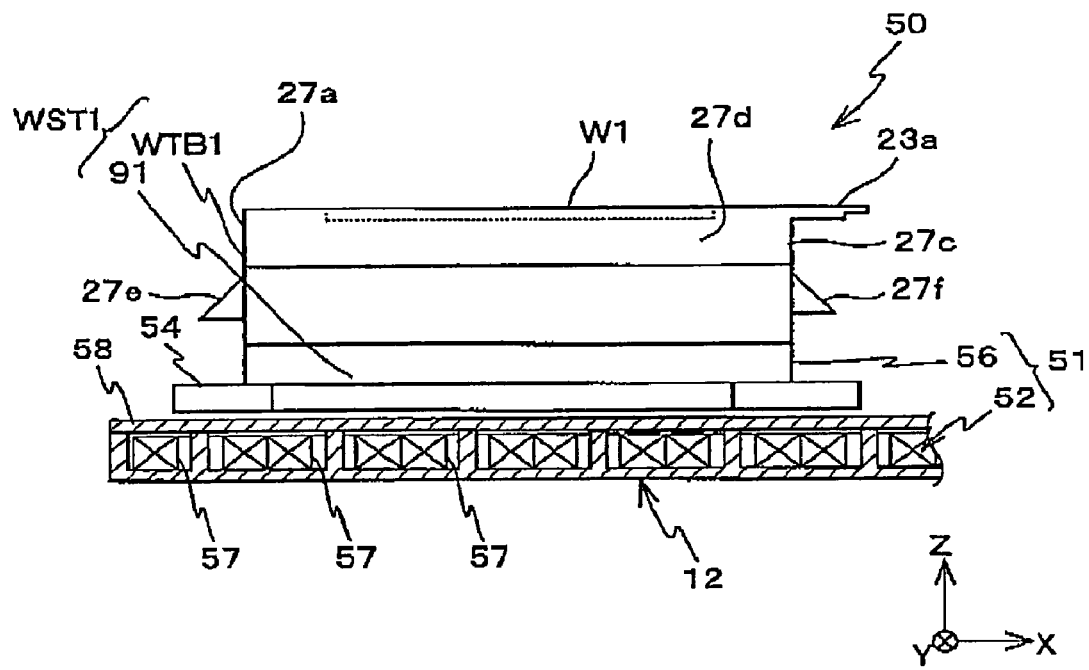
FIG. 2A shows a front view of wafer stage WST1 in FIG. 1.

Wafer stage WST1, as shown in FIGS. 1 and 2A, includes a stage main section 91, and a wafer table WTB1 mounted on stage main section 91. Stage main section 91, as shown in FIG. 2A, has a mover 56 which configures a planar motor 51 along with a stator 52 arranged inside base board 12, and an air slider 54, which is arranged integrally in the periphery of the lower half section of mover 56 and has a plurality of air bearings.

Mover 56 is configured, for example, by a magnet unit including a planar magnetism generating body consisting of a plurality of flat plate magnets having a matrix arrangement so that the polarity of adjacent pole faces are different from one another.

Meanwhile, stator 52 is configured by an armature unit having a plurality of armature coils (drive coils) 57 disposed in a matrix in the interior of base board 12. As armature coil 57, in the embodiment, an X drive coil and a Y drive coil are arranged. And, by stator 52 consisting of the armature unit including the plurality of X drive coils and Y drive coils and mover 56 consisting of the magnet unit previously described, a moving magnet type planar motor 51 by an electromagnetic drive method (Lorentz force drive method) is configured.

Armature coil 57 is covered by a tabular member 58 that configures the upper surface of base board 12. The upper surface of tabular member 58 configures the movement guide surface of wafer stage WST1 (and WST2) and also the pressure receiving surface of the pressurized air from the air bearing which air slider 54 has.

Wafer table WTB1 is installed on stage main section 91 via a Z leveling mechanism (for example, including voice coil motors and the like), which configures a part of stage drive system 124. Wafer table WTB1 is driven finely in the Z-axis direction, the θx direction, and the θy direction with respect to stage main section 91 by the Z leveling mechanism. Accordingly, wafer table WTB1 is configured drivable in directions of six degrees of freedom (X, Y, Z, θx, θy, and θz) with respect to base board 12, by stage drive system 124 including planar motor 51 and the Z leveling mechanism.

Figure 2B:
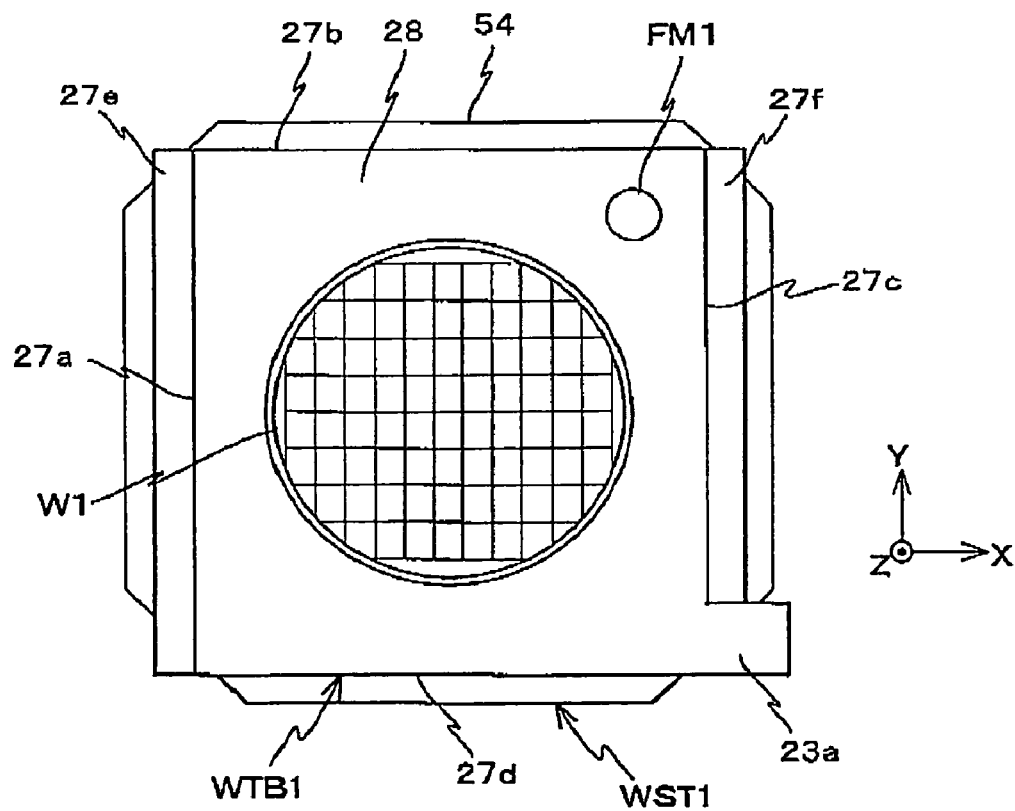
FIG. 2B is a planar view showing wafer stage WST1.

In the center of the upper surface of wafer table WTB1, a wafer holder (not shown) is arranged which holds the wafer by vacuum suction or the like. On the outer side of the wafer holder (mounting area of the wafer), as shown in FIG. 2B, a plate 28 is arranged that has a circular opening one size larger than the wafer holder formed in the center, and also has a rough rectangular outer shape (contour). The surface of plate 28 forms a liquid repellent surface to which a liquid repellent treatment against liquid Lq is applied. Incidentally, plate 28 is set so that its entire surface (or a part of its surface) becomes substantially flush with the surface of wafer W.

Further, on the +Y side of plate 28 in the vicinity of the +X end, a circular opening is formed, and a fiducial mark plate FM1 is fitted in the opening. Fiducial mark plate FM1 has its surface arranged substantially flush with plate 28. On the surface of fiducial mark plate FM1, at least a pair of first fiducial marks detected by reticle alignment detection system 13 and a second fiducial mark detected by alignment system ALG are formed.

On the +X side of wafer table WTB1 at the −Y end, as shown in FIG. 2B, a plate-shaped eaves section 23a is arranged which protrudes more than the other sections. The entire surface of the upper surface of wafer table WTB1 is substantially flush, including wafer W1 and eaves section 23a.

Figure 3A:
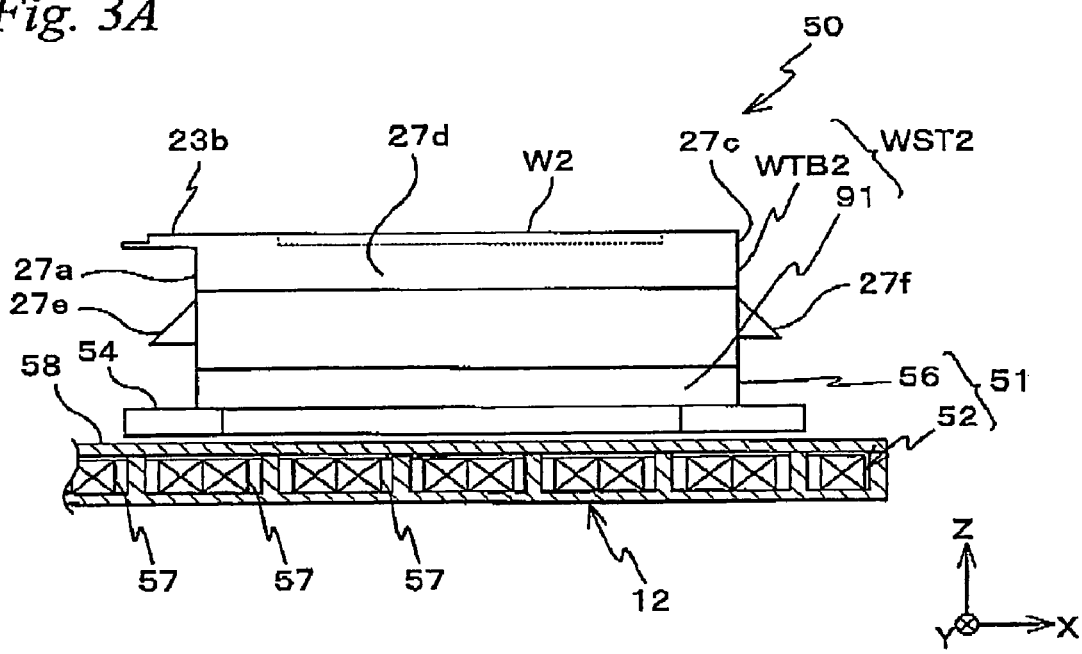
FIG. 3A shows a front view of wafer stage WST2 in FIG. 1.
Figure 3B:
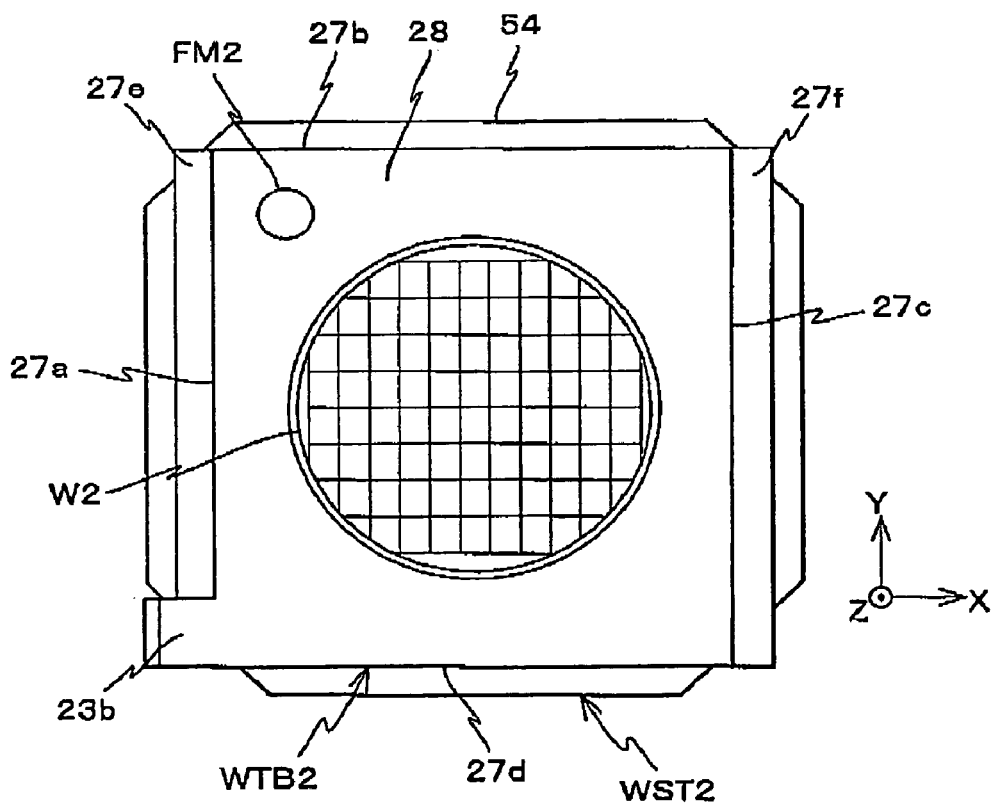
FIG. 3B is a planar view showing wafer stage WST2.

Wafer stage WST2, as shown in FIGS. 1, 3A, and 3B, includes stage main section 91 and a wafer table WTB2, and is configured in a similar manner, although symmetrical with wafer stage WST1 described above. However, in wafer stage WST2, fiducial mark plate FM2 is arranged on the wafer table WTB2 upper surface in a placement symmetric to the placement of fiducial mark FM1 on wafer table WTB1, and an eaves section 23b is arranged in a placement symmetric to eaves section 23a of wafer table WTB1.

Eaves section 23a and 23b will now be described in detail.

Figure 4A:
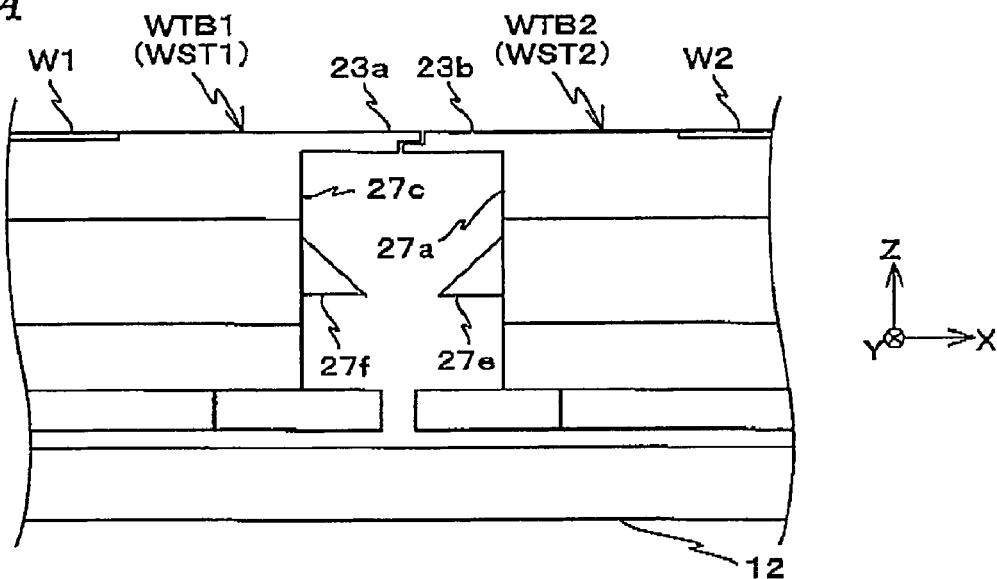
FIGS. 4A to 4C are views used to explain a delivery portion.

FIG. 4A shows an enlarged view of eaves section 23a arranged in wafer table WTB1 and eaves section 23b arranged in wafer table WTB2. As shown in FIG. 4A, eaves section 23a consists of a substantially tabular section protruding from the upper end on the +X side of wafer table WTB1, and at the tip a projecting section is formed whose upper half projects out when compared with the lower half. On the other hand, eaves section 23b consists of a substantially tabular section protruding from the upper end on the −X side of wafer table WTB2, and at the tip, a projecting section is formed whose lower half projects out when compared with the upper half and engages with the projecting section of eaves section 23a, and in the engaged state, forms a plate section as a whole as shown in FIG. 4A.

As is obvious from FIG. 4A, the tip of eaves section 23a and 23b are each located on the +X side end of wafer stage WST1 and the −X side end of wafer stage WST1, respectively. Further, the length of eaves section 23a and eaves section 23b in total in a state where eaves sections 23a and 23b are engaged is set to a level of length where wafer stage WST1 and wafer stage WST2 can be kept from coming into contact (to be more precise, keep the +X side end of air slider 54 of wafer stage WST1, and the −X side end of air slider 54 of wafer stage WST from coming into contact), even though a part of the tip has an overlapping section. In this case, in the state where eaves sections 23a and 23b are engaged, not only the contact of air sliders 54 described above, but also a reflection mirror 27f (to be described later on) arranged projecting on the +X side end of wafer stage WST1 and a reflection mirror 27e (to be described later on) arranged projecting on the −X side end of wafer stage WST2 can also be kept from coming into contact as shown in FIG. 4A. More specifically, the protrusion length of each of the eaves sections 23a and 23b is not a problem in particular, as long as wafer stage WST1 and wafer stage WST2 can be kept from coming into contact, and reflection mirror 27f and reflection mirror 27e can also be kept from coming into contact in a state where eaves sections 23a and 23b are engaged.

In the embodiment, in a state where wafer table WTB1 and wafer table WTB2, or to be more precise, eaves sections 23a and 23b move close together or come into contact (a scrum state of the two wafer stages), the upper surfaces of wafer table WTB1 and wafer table WTB2 include the upper surfaces of eaves sections 23a and 23b, and become a substantially flush surface (a completely flat surface) as a whole (refer to FIG. 4A). In this case, the term eaves sections 23a and 23b moving closer together, for example, refers to a state where eaves sections 23a and 23b approach each other via a clearance of around or less than 300 μm.

Figure 5:
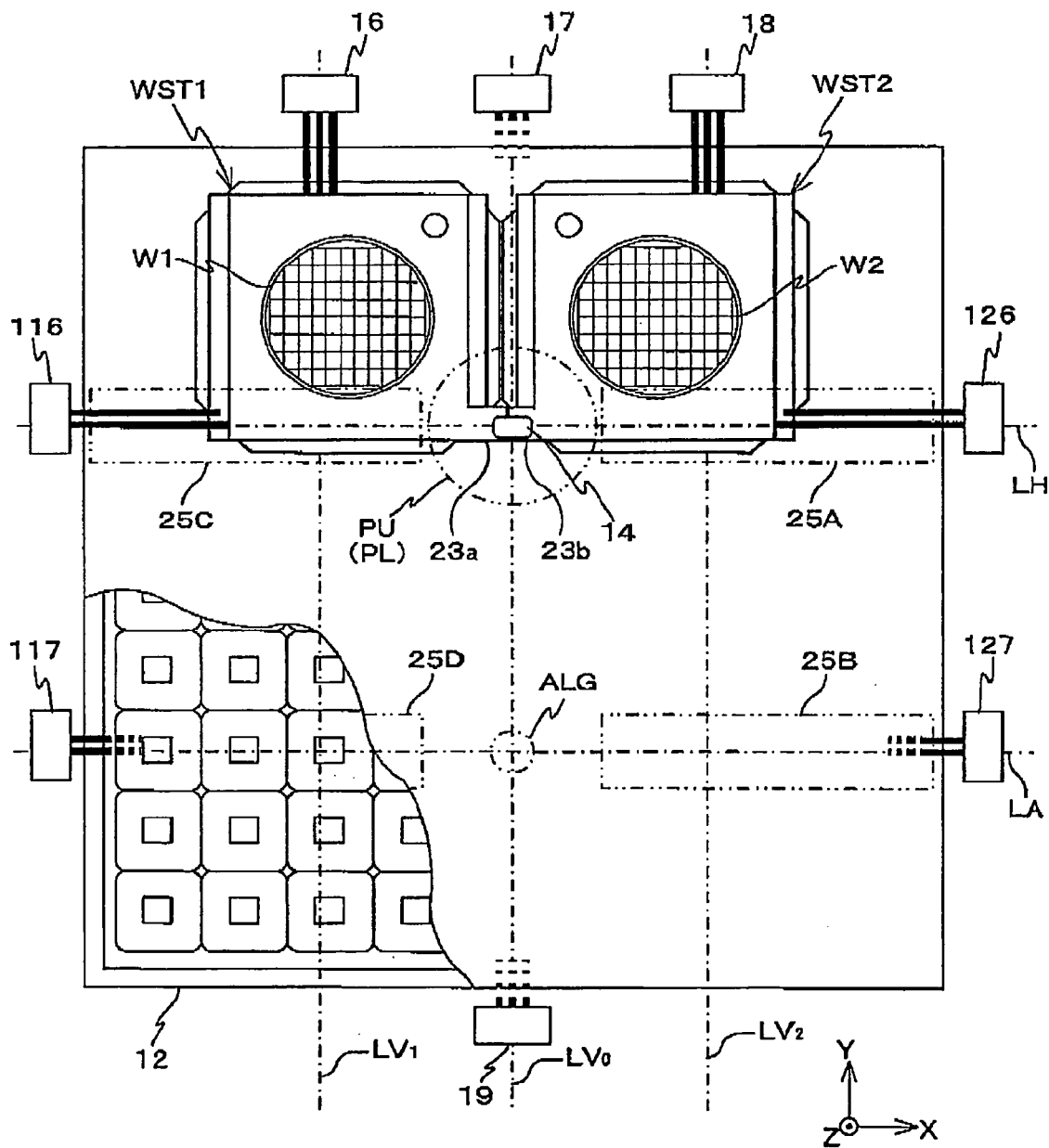
FIG. 5 is a planar view showing a placement of an interferometer system equipped in the exposure apparatus in FIG. 1.
Figure 10:
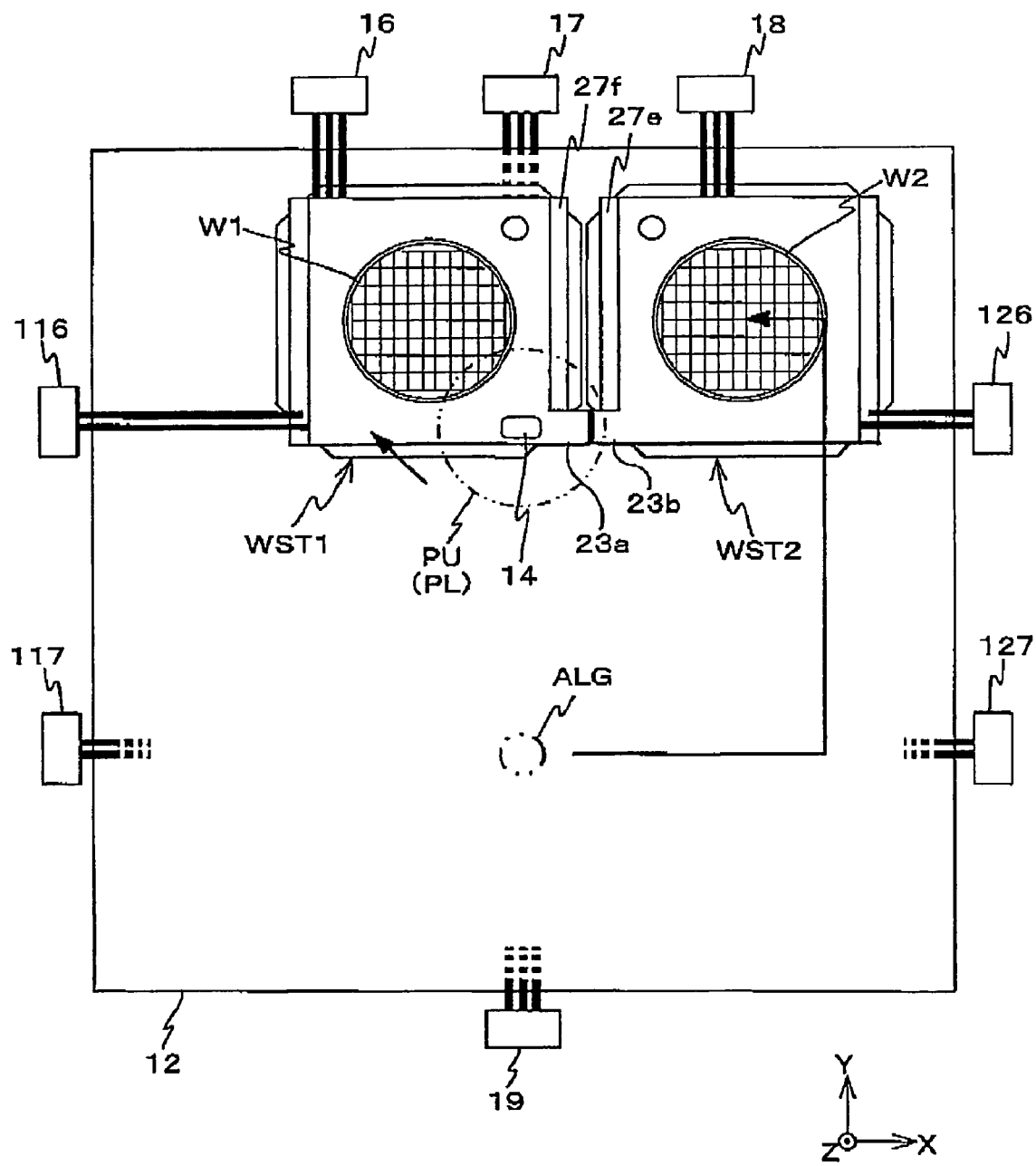
FIG. 10 is a view showing a state where movement to a scrum position of wafer stage WST1 and wafer stage WST2 has been completed.

The width of eaves section 23a is set sufficiently larger than the width of liquid immersion area 14 previously described, as shown in FIG. 5. Accordingly, for example, when exposure of wafer W1 mounted on wafer table WTB1 has been completed and in order to begin exposure of wafer W2 mounted on wafer table WTB2, wafer stage WST1 positioned at a movement area AE (refer to FIG. 8) at the time of exposure in the vicinity of projection optical system PL has to be withdrawn outside of exposure time movement area AE (refer to FIG. 8), and wafer stage WST2 waiting at a predetermined waiting position has to be moved to exposure time movement area AE. On this movement, as shown in FIG. 10, main controller 20 makes wafer stages WST1 and WST2 move into proximity or come into contact in the X-axis direction by engaging eaves section 23a that wafer stage WST1 has with eaves section 23b that wafer stage WST2 has. And, by main controller 20 driving both wafer stages WST1 and WST2 in the −X direction while maintaining this state (scrum state), liquid immersion area 14 sequentially moves from the upper surface of wafer table WTB1, eaves section 23a, eaves section 23b, and then to wafer table WTB2. As a matter of course, liquid immersion area 14 can be moved in a reverse order.

When liquid immersion area 14 moves from above wafer table WTB1 to wafer table WTB2 via eaves sections 23a and 23b, liquid Lq which forms liquid immersion area 14 may enter a gap between eaves section 23a and eaves section 23b and leak below the wafer stage WST1 and/or WST2 via the side surface of wafer stage WST1 and/or WST2. Therefore, for example, as shown in FIG. 4C, a seal member 24 should be put on a part of a surface of eaves section 23b which engages with eaves section 23a, or on the other hand, on a part of a surface of eaves section 23a which engages with eaves section 23b, or on a part of the engaging surfaces of both eaves section 23a and a stepped portion 23b. In such a case, by seal member 24, liquid Lq can be kept from entering the gap between eaves section 23a and eaves section 23b, which can prevent the leakage from occurring below wafer stage WST1 and/or WST2. Incidentally, as seal member 24, for example, an elastic seal member consisting of fluororubber or the like is used. Further, instead of pasting seal member 24, a water repellent coating can be applied by Teflon (a registered trademark) or the like on the engagement surface of eaves section 23a with the engagement surface of eaves section 23b, and/or the engagement surface of eaves section 23b with the engagement surface of eaves section 23a.

In the embodiment, as described above, liquid immersion area 14 can be moved between wafer tables WTB1 and WTB2, via eaves sections 23a and 23b. On this movement, because the state where eaves sections 23a and 23b are in contact or in proximity is maintained, this can also prevent liquid Lq of liquid immersion area 14 from leaking from the gap between eaves section 23a and eaves section 23b. Accordingly, liquid immersion area 14 can be moved between wafer tables WTB1 and WTB2 without getting reflection surfaces 27f and 27e wet with liquid Lq. By this arrangement, recovery operation of liquid Lq from the lower part of projection optical system PL becomes unnecessary, which makes it possible to improve throughput compared with the case when recovery and supply of liquid Lq are performed.

Figure 4B:
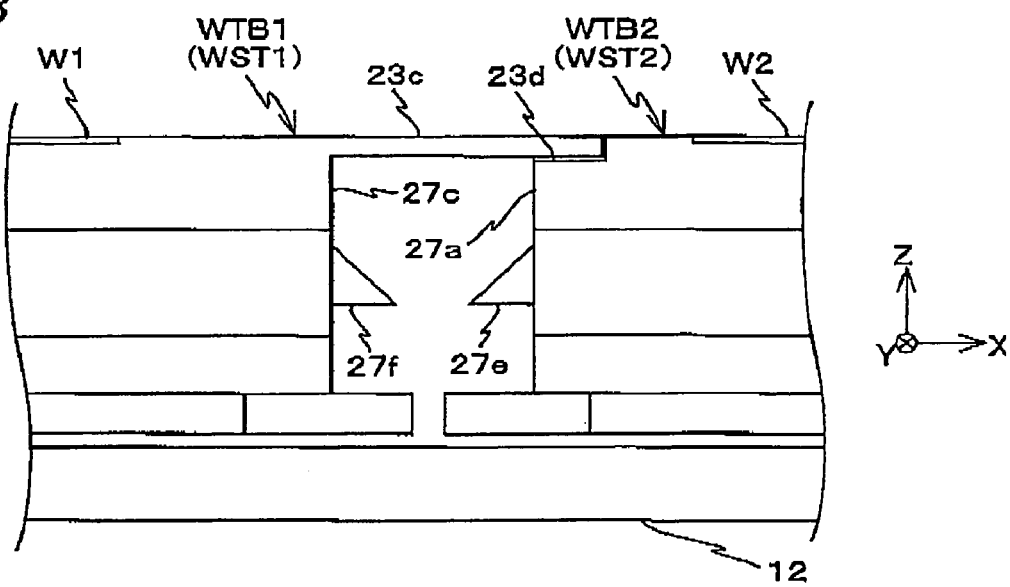
Figure 4C:
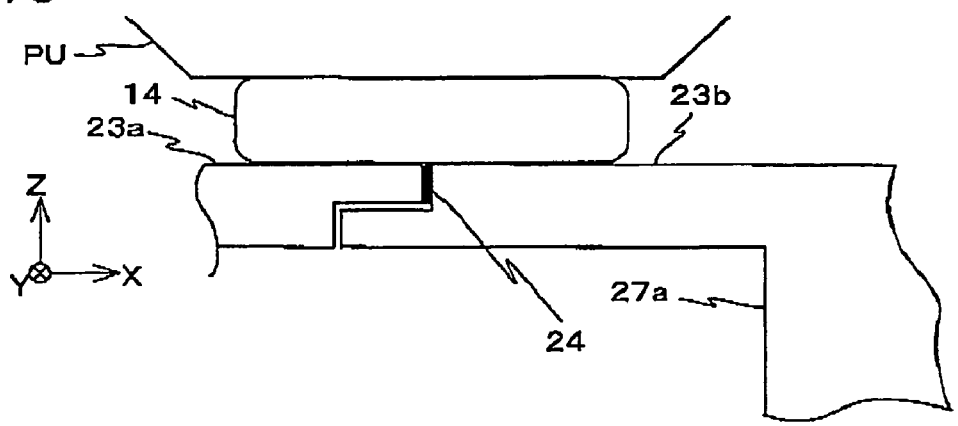

Incidentally, in the description above, while the case has been described where eaves sections 23a and 23b are arranged in wafer tables WTB1 and WTB2, respectively, for example, eaves section 23c can be arranged in wafer table WTB1 and a stepped portion 23d which fits in eaves section 23c can be arranged in wafer table WTB2 as shown in FIG. 4B. Or, on the contrary, the stepped portion can be arranged in wafer table WTB1 and the eaves section can be arranged in wafer table WTB2. In this case as well, in the scrum state of both wafer stages WST1 and WST2 where eaves section 23c and stepped portion 23d are fitted together, the length of eaves section 23c should be set to a length so that wafer stage WST1 and wafer stage WST2 is kept from coming into contact, and reflection mirror 27f and reflection mirror 27e can also be kept from coming into contact.

Furthermore, in wafer stages WST1, WST2, various measurement devices and measurement members such as a confidential bar (CD bar), an uneven illuminance measuring sensor, an aerial image measuring instrument, a wavefront aberration measuring instrument, an illuminance monitor and the like disclosed in, for example, the pamphlet of International Publication 2007/097379 can be arranged.

In the embodiment, from the −X side end of wafer stage WST1, a wiring/piping cable connects to a first cable shuttle (not shown) movable in the Y-axis direction arranged on the −X side of base board 12 (a movement guide surface of wafer stages WST1 and WST2). Similarly, from the +X side end of wafer stage WST2, a wiring/piping cable connects to a second cable shuttle (not shown) movable in the Y-axis direction arranged on the +X side of base board 12. By these cables, power supply to the Z leveling mechanism and the measurement devices and the supply of pressurized air to the air sliders arranged in both wafer stages WST1 and WST2 are performed.

Next, interferometer system 118 which configures a part of measurement system 200 will be described.

As shown in FIGS. 2B and 3B, reflection surfaces 27a, 27b, 27c, and 27d are formed on the −X side end surface, +Y side end surface, +X side end surface, and −Y side end surface of wafer tables WTB1 and WTB2, respectively. Furthermore, reflection mirrors 27e and 27f having an inclination of 45 degrees with respect to reflection surfaces 27a and 27c, respectively, are installed on the −X side and +X side of wafer stages WST1 and WST2. Further, as shown in FIGS. 1 and 5, fixed mirrors 25A, 25C, 25B, and 25D of a rectangular plate shape are placed with their reflection surfaces facing wafer stage WST2 or WST1 (wafer table WTB2 or WTB1) on the +X side and −X side of projection unit PU and the +X side and −X side of alignment system ALG, and their longitudinal directions in the X-axis direction. Fixed mirrors 25A to 25D are installed on the lower surface of the mainframe holding projection unit PU and the like.

As shown in FIG. 5, interferometer system 118 includes four Y interferometers 16, 17, 18, and 19, and four XZ interferometers 116, 117, 126, and 127. Y interferometers 16, 17, and 18 are placed on the +Y side of base board 12, at different positions in the X-axis direction. Y interferometer 19 is placed on the −Y side of base board 12, facing Y interferometer 17. XZ interferometers 116 and 117 are placed on the −X side of base board 12, at a predetermined distance in the Y-axis direction. Further, XZ interferometers 126 and 127 are placed on the +X side of base board 12, facing XZ interferometers 116 and 117, respectively.

Figure 6:
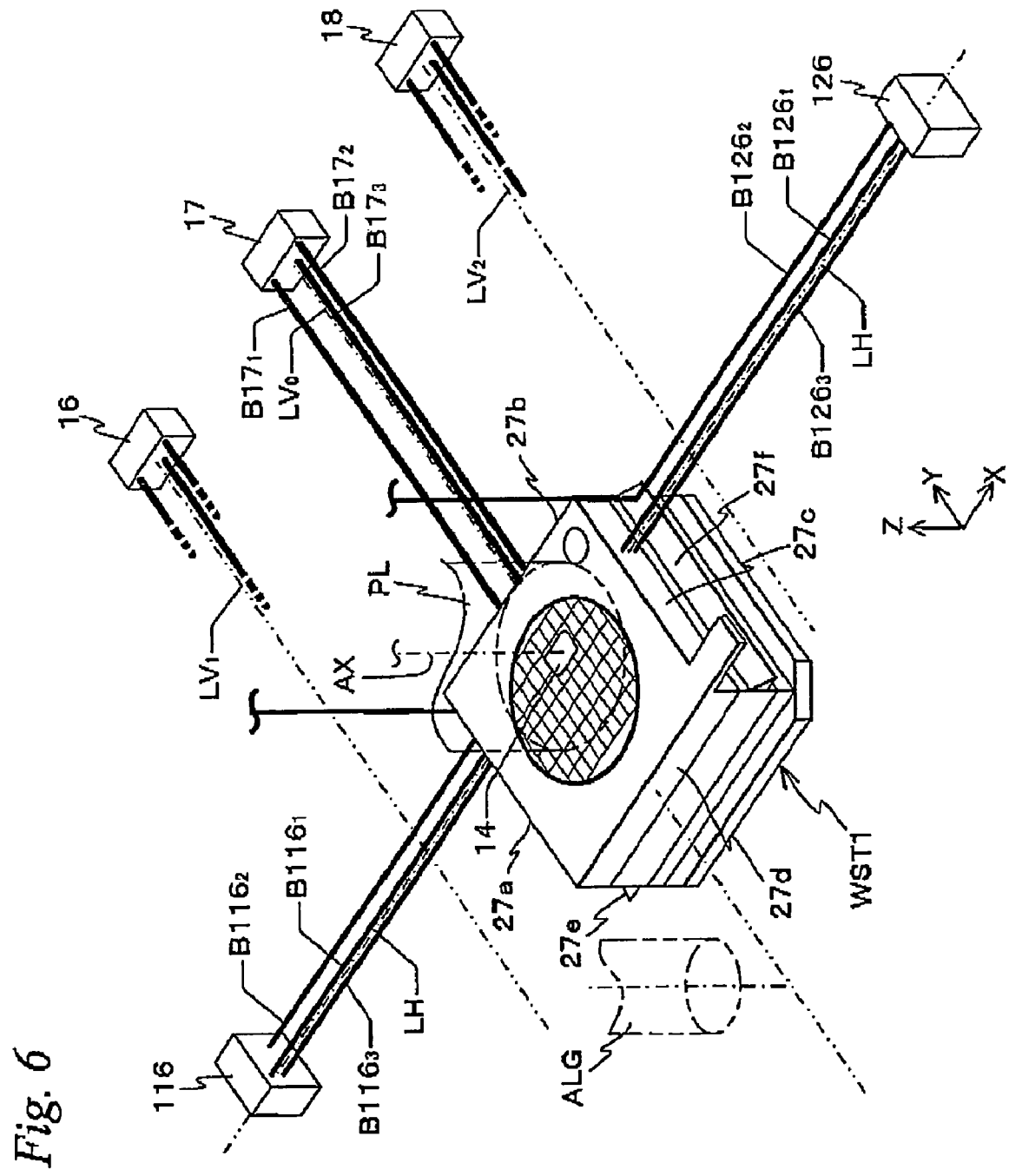
FIG. 6 is a view to explain position measurement of the wafer stage using three multiaxial interferometers.

More specifically, as shown in FIG. 6, Y interferometer 17 irradiates two measurement beams $B17_1$ and $B17_2$, which are parallel to the Y-axis and spaced apart equally in the X direction from a straight line (reference axis) $LV_0$ parallel to the Y-axis connecting optical axis AX of projection optical system PL and the detection center of alignment system ALG, on reflection surface 27b of wafer table WTB1 (or WTB2), and by receiving the reflected lights of measurement beams $B17_1$ and $B17_2$, measures the displacement of reflection surface 27b in the Y-axis direction (serving as a first and second positional information) at the irradiation points of measurement beams $B17_1$ and $B17_2$. The first and the second positional information is sent to main controller 20. Main controller 20 computes the position (the Y position) of wafer table WTB1 (or WTB2) in the Y-axis direction, based on an average value of the first and second positional information. That is, the substantial measurement axis in the Y-axis direction of Y interferometer 17 coincides with reference axis $LV_0$. Further, main controller 20 computes rotation information (yawing amount) in the θz direction of wafer table WTB1 (or WTB2), based on a difference between the first and second positional information.

Further, Y interferometer 17 irradiates another measurement beam $B17_3$, which is a predetermined distance away in the −Z direction from measurement beams $B17_1$ and $B17_2$, on reflection surface 27b, and by receiving the reflected light of measurement beam $B17_3$, measures the displacement of reflection surface 27b in the Y-axis direction (serving as a third positional information) at the irradiation point of measurement beam $B17_3$, and sends the measurement to main controller 20. Main controller 20 computes rotation information (pitching amount) in the θx direction of wafer table WTB1 (or WTB2), based on the third positional information, and the first and second positional information.

Y interferometers 16, 18, and 19 are used in a similar manner as Y interferometer 17, to measure the Y position, the pitching amount and the yawing amount of one of or both of wafer tables WTB1 and WTB2. Y interferometers 16 and 18 have measurement axes $LV_1$ and $LV_2$ which are parallel to reference axis $LV_0$, respectively. Further, reference axis $LV_0$ serves as a substantial measurement axis of Y interferometer 19, and Y interferometer 19 irradiates three measurement beams on reflection surface 27d of wafer table WTB1 (or WTB2).

In XZ interferometers 116 and 126, a reference axis LH, which is orthogonal to optical axis AX of projection optical system PL and reference axis $LV_0$, serves as a measurement axis in the X-axis direction. More specifically, as shown in FIG. 6, XZ interferometer 116 irradiates a measurement beam $B116_1$ on reflection surface 27a of wafer table WTB1 (or WTB2) along measurement axis LH, and by receiving a reflected light of measurement beam $B116_1$ reflected off reflections surface 27a, measures the displacement of reflection surface 27a in the X-axis direction (serving as a fourth positional information) at the irradiation point of measurement beam $B116_1$. Similarly, XZ interferometer 126 irradiates a measurement beam $B126_1$ on reflection surface 27c of wafer table WTB1 (or WTB2) along measurement axis LH, and by receiving a reflected light of measurement beam $B126_1$ reflected off reflections surface 27c, measures the displacement of reflection surface 27c in the X-axis direction (serving as a fifth positional information) at the irradiation point of measurement beam $B126_1$. The fourth and fifth positional information is sent to main controller 20. Main controller 20 computes the X position of wafer table WTB1 (or WTB2), based on the fourth and fifth positional information.

Further, XZ interferometer 116 irradiates a measurement beam (Z measurement beam) $B116_2$ on the reflection surface of reflection mirror 27e arranged in wafer table WTB1 (or WTB2), in parallel with measurement axis LH. Measurement beam $B116_2$ is reflected in the +Z direction by reflection mirror 27e, and is irradiated on the reflection surface of fixed mirror 25C previously described. A reflected light of measurement beam $B116_2$ from the reflection surface of fixed mirror 25C follows the original optical path back, and is received by XZ interferometer 116. XZ interferometer 116 measures an optical path length (change) of measurement beam $B116_2$, and sends the measurement results to main controller 20. Similarly, XZ interferometer 126 irradiates a measurement beam (Z measurement beam) $B126_2$ on the reflection surface of reflection mirror 27f arranged in wafer table WTB1 (or WTB2), in parallel with measurement axis LH. Measurement beam $B126_2$ is reflected in the +Z direction by reflection mirror 27f, and is irradiated on the reflection surface of fixed mirror 25A previously described. A reflected light of measurement beam $B126_2$ from the reflection surface of fixed mirror 25A follows the original optical path back, and is received by XZ interferometer 126. XZ interferometer 126 measures an optical path length (change) of measurement beam $B126_2$, and sends the measurement results to main controller 20.

Main controller 20 computes the Z position (to be expressed as Ze) of the irradiation point on the reflection surface of reflection mirror 27e of measurement beam $B116_2$ from a difference between the optical path length of measurement beam $B116_1$ obtained from the fourth positional information previously described and the optical path length of measurement beam $B116_2$. Further, main controller 20 computes the Z position (to be expressed as Zf) of the irradiation point on the reflection surface of reflection mirror 27f of measurement beam $B126_2$ from a difference between the optical path length of measurement beam $B126_1$ obtained from the fifth positional information previously described and the optical path length of measurement beam $B126_2$. Furthermore, from an average value and a difference of the two Z positions Ze and Zf, main controller 20 computes a Z position and the rotation information (rolling amount) in the θy direction of wafer table WTB1 (or WTB2).

Furthermore, as shown in FIG. 6, XZ interferometers 116 and 126 irradiate measurement beams $B116_3$ and $B126_3$ which are parallel to measurement axis LH but a predetermined distance away from measurement beams $B116_1$ and $B126_1$ in the −Z direction, on reflection surfaces 27a and 27c, respectively. And XZ interferometers 116 and 126 receive the reflected lights of measurement beams $B116_3$ and $B126_3$, and measure the displacement of reflection surfaces 27a and 27c in the X-axis direction (serving as a sixth and seventh positional information) at the irradiation point of measurement beams $B116_3$ and $B126_3$. The sixth and seventh positional information is sent to main controller 20. Main controller 20 computes the rolling amount (expressed as θy1) of wafer table WTB1 (or WTB2), based on the fourth positional information and the sixth positional information. Further, main controller 20 computes the rolling amount (expressed as θy2) of wafer table WTB1 (or WTB2), based on the fifth positional information and the seventh positional information. Further, main controller 20 computes the Z position of wafer table WTB1 (or WTB2), based on Z position (Ze) and rolling amount θy1 described above. Further, main controller 20 computes the Z position of wafer table WTB1 (or WTB2), based on Z position (Zf) and rolling amount θy2 described above.

However, the separation distance of measurement beams $B116_1$ and $B116_3$ and the separation distance of measurement beams $B126_1$ and $B126_3$ are much shorter when compared with the distance in the X-axis direction of the irradiation points of measurement beams (Z measurement beams) $B116_2$ and $B126_2$ on the reflection surface of reflection mirrors 27e and 27f. Accordingly, the measurement accuracy of the rolling amount of wafer table WTB1 (or WTB2) is inferior when compared with the measurement using Z measurement beams $B116_2$ and $B126_2$ previously described. Therefore, main controller 20 is to perform measurement of the positional information (rolling amount) in the θy direction of wafer table WTB1 (or WTB2) and the Z position using Z measurement beams B1162 and B1262, or more specifically, using both XZ interferometers 116 and 126 as a general rule, and as an alternative method, exceptionally, is to perform measurement using only either one of XZ interferometers 116 and 126. Incidentally, an example of the use of the alternative method will be described later on.

XZ interferometers 117 and 127 are used like XZ interferometers 116 and 126, to measure the X position, the Z position, and the position (rolling amount) in the θy direction of wafer table WT1 (WT2) at the time of wafer alignment and the like. Incidentally, the measuring method is similar to the measurement using XZ interferometers 116 and 126, except for the points that a reference axis LA (refer to FIG. 5) which is parallel to the X-axis and is orthogonal to reference axis $LV_0$ at the detection center of alignment system ALG is used as the measurement axis, and fixed mirrors 25D and 25B are respectively used as the fixed mirrors on which the Z measurement beams are irradiated, which are different.

As described above, by using interferometer system 118 including Y interferometers 16, 17, 18, and 19 and XZ interferometers 116, 117, 126, and 127, positional information of wafer table WTB1 (or WTB2) in directions of six degrees of freedom (X, Y, Z, θx, θy, and θz) can be measured. Incidentally, in the embodiment, based on the placement of the individual interferometers, in movement area AE at the time of exposure, main controller 20 uses Y interferometer 17 and XZ interferometers 116 and 126, whereas in an alignment area AA (refer to FIG. 9) in the vicinity of alignment system ALG where wafers stages WST1 and WST2 move at the time of wafer alignment, uses Y interferometer 19 and XZ interferometers 117 and 127. Further, at a waiting area (an area on the −X side of base board 12) for wafer stage WST1 when wafer stage WST1 moves back and forth between exposure time movement area AE and alignment area AA, main controller 20 uses Y interferometer 16 and XZ interferometers 116 and 126 or 117 and 127, whereas at a waiting area (an area on the +X side of base board 12) for wafer stage WST2 when wafer stage WST2 moves back and forth between exposure time movement area AE and alignment area AA, uses Y interferometer 18 and XZ interferometers 116 and 126 or 117 and 127.

In the embodiment, in order to measure positional information of wafer table WTB1 (or WTB2) in the XY plane, an encoder system 150 (refer to FIG. 7) is arranged separately from interferometer system 118 described above. Therefore, main controller 20 performs position measurement of wafer table WTB1 (or WTB2) mainly using interferometer system 118, and uses encoder system 150 when wafer stage WST1 (or WST2) is located outside the measurement area of interferometer system 118 as it will be described later on. As a matter of course, main controller 20 can also perform position measurement of wafer table WTB1 (or WTB2) within the XY plane using interferometer system 118 and encoder system 150 together.

FIG. 7 shows the main configuration of the control system of exposure apparatus 100. The control system is mainly configured of main controller 20 composed of a microcomputer (or workstation) that performs overall control of the entire apparatus.

Next, a parallel processing operation that uses wafer stage WST1 and wafer stage WST2 will be described, based on FIGS. 8 to 11, and FIG. 5. Incidentally, during the operation described below, main controller 20 controls liquid supply device 5 and liquid recovery device 6 so that liquid Lq is supplied to and recovered from the space under tip lens 191 of projection optical system PL and a constant quantity of liquid Lq is held therein, which constantly forms liquid immersion area 14.

Figure 8:
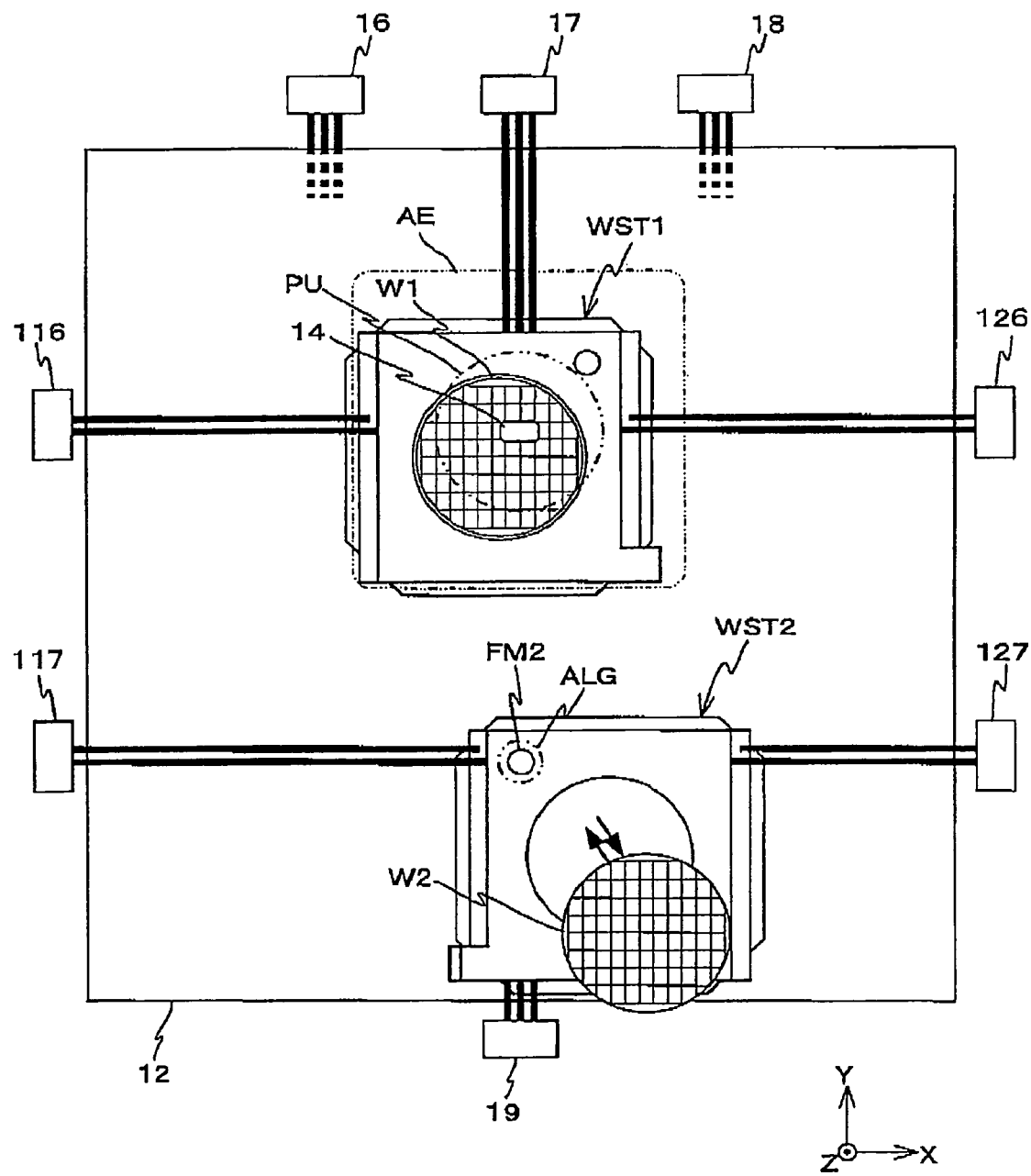
FIG. 8 is a view showing a state where exposure is performed on a wafer placed on wafer stage WST1, and wafer exchange is performed on wafer stage WST2.

FIG. 8 shows a state in which exposure by the step-and-scan method is performed on wafer W1 mounted on wafer stage WST1 in exposure time movement area AE, and wafer exchange is concurrently performed between a wafer carriage mechanism (not shown) and wafer stage WST2, at a second loading position. In this case, the second loading position is set as a position of wafer stage WST2 when a fiducial mark plate FM2 is positioned right below alignment system ALG in the embodiment.

During the wafer exchange described above and the wafer exchange, while wafer stage WST2 comes to a standstill at the second loading position, main controller 20 resets (origin reset) of Y interferometer 19 and XZ interferometers 117 and 127, prior to beginning wafer alignment (and other preprocessing measurements) of a new wafer W2.

When wafer exchange (loading of the new wafer W2) and reset of interferometers 19, 117, and 127 are completed, main controller 20 detects the second fiducial mark on fiducial mark plate FM2, using alignment system ALG. Then, main controller 20 detects the position of the second fiducial mark which uses the index center of alignment system ALG as a reference, and based on the detection results and results of position measurement of wafer stage WST2 according to interferometers 19, 117, and 127 at the time of the detection, main controller 20 computes the position coordinate of the second fiducial mark in an orthogonal coordinate system (an alignment coordinate system) which uses reference axis LA and reference axis $LV_0$ as the coordinate axes.

Figure 9:
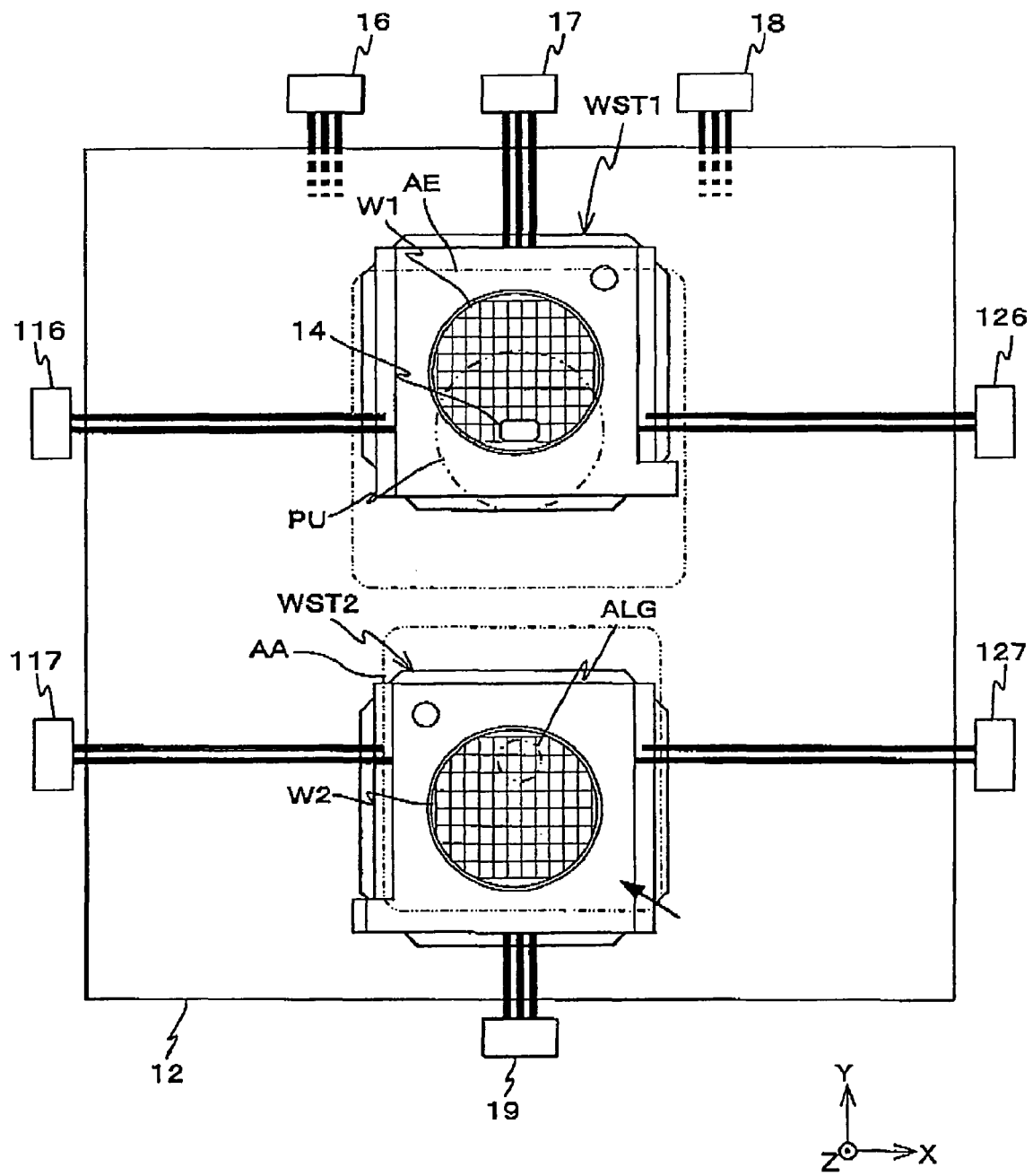
FIG. 9 is a view showing a state where exposure is performed on a wafer placed on wafer stage WST1, and wafer exchange is performed on wafer stage WST2.

Next, main controller 20 moves wafer stage WST2 to alignment area AA, as shown in FIG. 9. Then, main controller 20 performs enhanced global alignment (EGA), while measuring the position coordinate of wafer stage WST2 in the alignment coordinate system using interferometers 19, 117, and 127. To explain this in detail, main controller 20 detects a plurality of alignment marks arranged in a plurality of shot areas (sample shot areas) which are specified on wafer W2 using alignment system ALG and obtains their position coordinates while controlling the position coordinate of wafer stage WST2 using interferometers 19, 117, and 127. Based on the position coordinate which has been obtained and a design position coordinate, a statistics operation disclosed in, for example, U.S. Pat. No. 4,780,617 and the like is performed, and a position coordinate of the plurality of shot areas in the alignment coordinate system is computed. Furthermore, the position coordinate of the second fiducial mark detected earlier is subtracted from the position coordinate that has been computed, and the position coordinate of the plurality of shot areas on wafer W2 using the position of the second fiducial mark as an origin is obtained.

The wafer exchange/wafer alignment sequence described above is normally completed earlier than the exposure sequence. Therefore, when wafer alignment is completed, main controller 20 moves wafer stage WST2 outside alignment area AA, and during the movement, switches the interferometer used to measure the position of wafer table WTB2 in the Y-axis direction, the θx direction, and the θz direction from Y interferometer 19 to Y interferometer 18. Then, main controller 20 makes wafer stage WST2 wait at the predetermined waiting position, until exposure of wafer W1 on wafer stage WST1 has been completed.

When exposure to wafer W1 on wafer table WTB1 has been completed, main controller 20 drives wafer stages WST1 and WST2 to their predetermined positions (right side scrum positions) as shown in FIG. 10. After the movement of wafer stage WST1 to the right side scrum position begins, main controller 20 switches the Y interferometer used in position measurement of wafer stage WST1 from Y interferometer 17 to Y interferometer 16. Further, at this point, the three measurement beams of XZ interferometer 126 which have been irradiated on wafer stage WST1 are interrupted by wafer stage WST2 which moves toward the right side scrum position, and the position of wafer stage WST1 using XZ interferometer 126 can no longer be measured. Therefore, main controller 20 measures the X, Z, and θy positions of wafer table WTB1, using only XZ interferometer 116. Main controller 20 uses the alternative method previously described herein to measure the θy position and the Z position. Meanwhile, as is obvious from FIG. 10, during the movement of wafer stage WST2 toward the right side scrum position, the measurement beams from XZ interferometers 117 and 127 will no longer hit wafer stage WST2, which causes a state in which the measurement beams from both XZ interferometers do not hit wafer stage WST2. Therefore, before this condition occurs, main controller 20 begins measurement of the X position of wafer stage WST2 using encoder system 150 previously described. Then, at a point when the three measurement beams from XZ interferometer 126 come to hit each reflection surface of wafer stage WST2, preset of XZ interferometer 126 is performed, based on measurement values of encoder system 150. Further, as is obvious from FIG. 10, in the state where wafer stage WST2 has moved to the scrum position, because the three measurement beams of XZ interferometer 116 are interrupted by wafer stage WST1, main controller 20 uses only XZ interferometer 126 to measure the X, Z, and θy positions of wafer table WTB2. Main controller 20 also uses the alternative method previously described herein to measure the θy position and the Z position.

And, in the state where both wafer stages WST1 and WST2 have moved to the right side scrum position, eaves section 23a of wafer stage WST1 becomes engaged with eaves section 23b of wafer stage WST2, and both wafer stages WST1 and WST2 move into proximity or come into contact via eaves sections 23a and 23b, into a scrum state, as shown in FIG. 10. Main controller 20 drives both wafer stages WST1 and WST2 in the −X-direction, while keeping this scrum state.

As wafer stages WST1 and WST2 move in the −X direction while keeping the scrum state, liquid immersion area 14 formed in the space between tip lens 191 and wafer table WTB1 sequentially moves from the area over wafer table WTB1, eaves section 23a, eaves section 23b, and then to wafer table WTB2. FIG. 5 shows a state in which liquid immersion area 14 is passed from over eaves section 23a to eaves section 23b.

Figure 11:
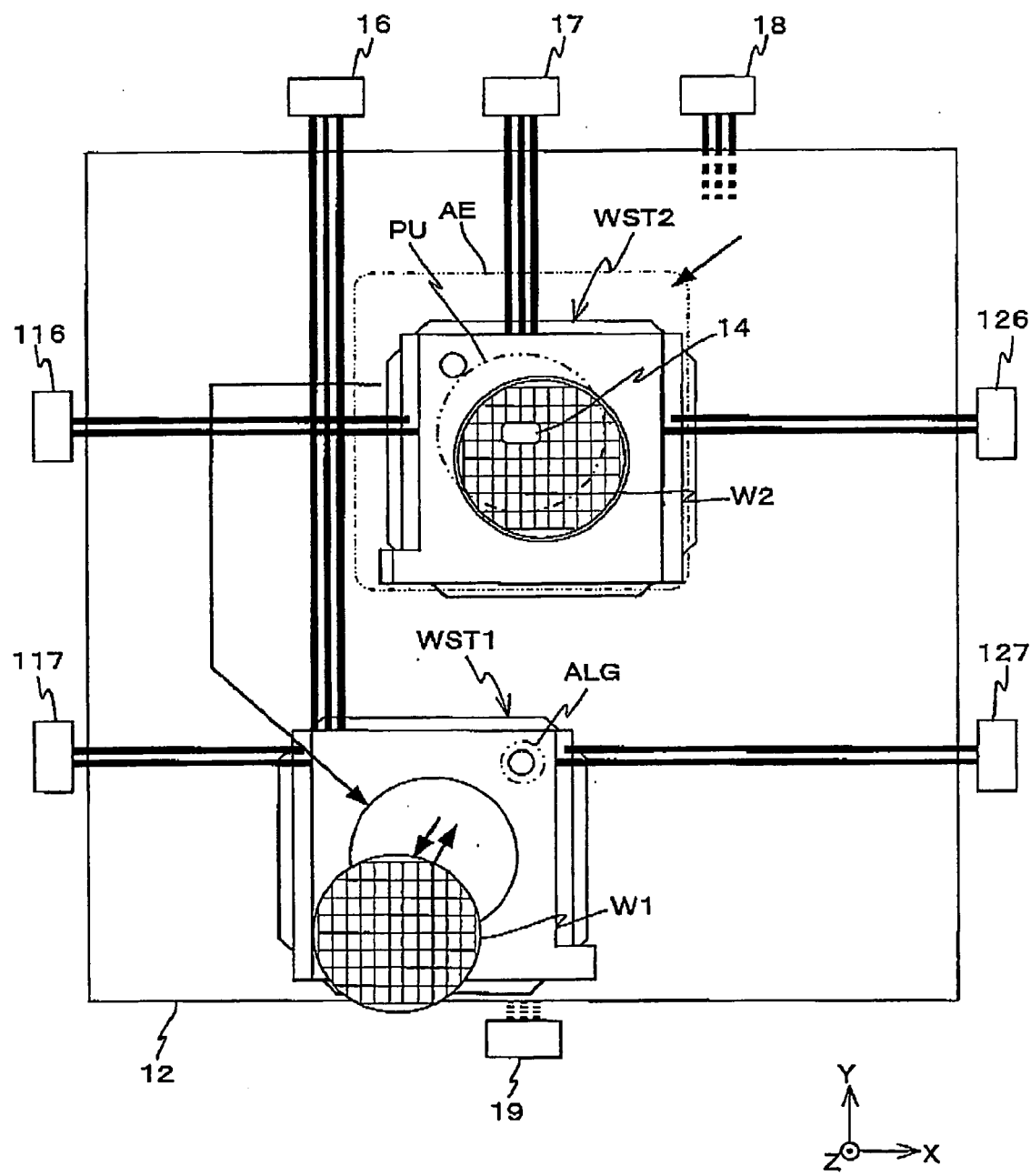
FIG. 11 is a view showing a state where exposure is performed on a wafer placed on wafer stage WST1, and wafer exchange is performed on wafer stage WST2.

When the movement of liquid immersion area 14 to above wafer table WTB2 is completed, main controller 20 moves wafer stage WST1 to the first loading position, as shown in FIG. 11. Incidentally, the first loading position is to be decided to a position of wafer stage WST1 when fiducial mark plate FM1 is positioned right below alignment system ALG.

As is obvious from FIG. 11, during the movement of wafer stage WST1 toward the first loading position, the measurement beams from XZ interferometer 116 will no longer hit wafer stage WST1, which causes a state in which the measurement beams from any of the XZ interferometers do not hit wafer stage WST1. Therefore, before this condition occurs, main controller 20 begins measurement of the X position of wafer stage WST1 using encoder system 150 previously described. Then, at a point when the three measurement beams each from XZ interferometers 117 and 127 come to hit each reflection surface of wafer stage WST1, preset of XZ interferometers 117 and 127 is performed, based on measurement values of encoder system 150. Then, main controller 20 drives wafer stage WST1 further toward the first loading position while performing position measurement using interferometers 16, 117, and 127.

In parallel with the movement of wafer stage WST1, main controller 20 drives wafer stage WST2 and positions fiducial mark plate FM2 directly below projection optical system PL. Then, the pair of first fiducial marks on fiducial mark plate FM2 is detected using reticle alignment detection system 13 (refer to FIG. 7), and a relative position of the projected image on the wafer surface of the reticle alignment mark on reticle R corresponding to the first reference mark is detected. Incidentally, this detection is performed via projection optical system PL and liquid Lq forming liquid immersion area 14. Hereinafter, the relative position detection in this case will also be referred to as a reticle alignment.

Main controller 20 computes the relative positional relation of the projection position (projection center of projection optical system PL) of the pattern of reticle R and each shot area on wafer W2, based on the relative position information which has been detected and the positional information which has been obtained beforehand of each shot area on wafer W using the second fiducial mark as a reference. And, based on the computation results, main controller 20 transfers the pattern of reticle R onto each shot area on wafer W2 by the step-and-scan method, while controlling the position of wafer stage WST2 as in the case of wafer W1 previously described.

In parallel with the exposure operation of wafer stage WST2 described above, main controller 20 performs wafer exchange between the wafer carrier mechanism (not shown) and wafer stage WST1 at the first loading position, and a new wafer W1 is mounted on wafer table WTB1. Then, the second fiducial mark on fiducial mark plate FM1 is detected, using alignment system ALG. Incidentally, prior to the detection of the second fiducial mark, main controller 20 resets (origin reset) Y interferometer 19 and XZ interferometers 117 and 127 in a state where wafer stage WST1 is at the first loading position. Then, main controller 20 performs wafer alignment (EGA) on wafer W1 as is previously described using alignment system ALG, while controlling the position of wafer stage WST1.

When wafer alignment (EGA) of wafer W1 on wafer table WTB1 has been completed and exposure of wafer W2 on wafer table WTB2 has also been completed, main controller 20 drives wafer stages WST1 and WST2 toward a left side scrum position. This left side scrum position refers to a position in which wafer stages WST1 and WST2 are located at positions symmetrical with respect to reference axis $LV_0$ previously described, with the right side scrum position shown in FIG. 10. In this left side scrum position as well, eaves section 23a of wafer stage WST1 becomes engaged with eaves section 23b of wafer stage WST2, and both wafer stages WST1 and WST2 move into a scrum state. Main controller 20 drives both wafer stages WST1 and WST2 in the +X direction, which is opposite to the preceding drive, while keeping this scrum state. With this drive, liquid immersion area 14 formed in the space between tip lens 191 and wafer table WTB2 moves sequentially in reverse, from wafer table WTB2, eaves section 23b, eaves section 23a, and then on wafer table WTB1. When the movement of liquid immersion area 14 has been completed, main controller 20 begins exposure of wafer W1 on wafer stage WST1 in a procedure similar to the one previously described. In parallel with this exposure operation, main controller 20 drives wafer stage WST2 in a similar manner as is previously described toward the second loading position, exchanges wafer W2 which has been exposed on wafer stage WST2 to a new wafer W2, and then performs wafer alignment on the new wafer W2.

Hereinafter, main controller 20 repeatedly performs the parallel operation of wafer stages WST1 and WST2 described above.

As discussed in detail above, according to exposure apparatus 100 of the embodiment, on the −Y end (a position where measurement of positional information in the Z-axis direction of wafer stage WST1 by XZ interferometers 126 and 127 using reflection mirror 27f is not substantially obstructed) of a surface on the +X side of wafer stage WST1, eaves section 23a whose width in the Y-axis direction is wider than liquid immersion area 14 and protrudes in the +X direction is arranged, and on the −Y end (a position where measurement of positional information in the Z-axis direction of wafer stage WST2 by XZ interferometers 116 and 117 using reflection mirror 27e is not substantially obstructed) of a surface on the −X side of wafer stage WST2, eaves section 23b which engages with eaves section 23a in a contact state or in a proximity state via a clearance of around 300 μm and has a width in the Y-axis direction substantially the same as eaves section 23a is arranged in a state protruding in the −X direction. Further, in the embodiment, as shown in FIG. 4A, the total length of eaves sections 23a and 23b in the engaged state is set so that contact of wafer stage WST1 with wafer stage WST2 and contact of reflection mirror 27f with reflection mirror 27e can be avoided in the state where eaves sections 23a and 23b are engaged.

Then, by simultaneously driving wafer stages WST1 and WST2 in the X-axis direction while maintaining the scrum state in which wafer stages WST1 and WST2 are in contact or in proximity in the X-axis direction via eaves sections 23a and 23b, main controller 20 passes liquid immersion area 14 formed just below projection unit PU (projection optical system PL) from one of wafer stage WST1 and wafer stage WST2 to the other via eaves sections 23a and 23b, and performs transition from a first state in which one of the wafer stages is positioned at exposure time movement area AE to a second state in which the other wafer stage is positioned at exposure time movement area AE.

This makes the transition from the first state to the second state previously described, or conversely the second state to the first state possible, in a state where liquid immersion area 14 is formed in the space between projection optical system PL (projection unit PU) and the wafer table (or the wafer mounted on the wafer table) located just below projection optical system PL without liquid Lq leaking from the gap between both wafer stages WST1 and WST2. This will keep the reflection surfaces of reflection mirrors 27e and 27f, which are arranged on a surface on the side facing each other in the scrum state, from getting wet by the liquid, which ensures high stability of position measurement of the wafer stage by XZ interferometers 116, 117, 126, and 127, using the reflection surfaces of reflection mirrors 27e and 27f.

Further, even when both wafer stages WST1 and WST2 are in the scrum state, XZ interferometers 116 and 126 can perform position measurement of the wafer stage, and liquid immersion area 14 can be moved more securely.

Further, the process of collecting all the liquid forming liquid immersion area 14 and supplying the liquid again will not be necessary, from after exposure of the wafer has been performed at one of the wafer stages via projection optical system PL and liquid Lq of liquid immersion area 14 until exposure of the wafer via projection optical system PL and liquid immersion area 14 begins at the other wafer stage. Accordingly, the time from the end of exposure on one of the wafer stages to the beginning of exposure on the other stage can be shortened to around the same level as in the exposure apparatus by the non-liquid immersion method, which allows the throughput to be improved. Further, because the liquid is constantly present on the image plane side of projection optical system PL, this can effectively prevent water stains (water marks) from being generated on the optical members (for example, tip lens 191) on the image plane side of projection optical system PL, which makes it possible to favorably maintain the image-forming characteristics of projection optical system PL for over a long period of time.

Further, by the parallel operation of the two wafer stages WST1 and WST2 previously described, the throughput can be improved when compared with a conventional exposure apparatus equipped with a single stage that sequentially performs wafer exchange, wafer alignment, and exposure operation using only one wafer stage.

Further, by performing exposure with high resolution and a larger depth of focus than in the air by means of the liquid immersion exposure, the pattern of reticle R can be transferred with good precision on the wafer, and for example, transfer of a fine pattern that has a device rule of around 70 to 100 nm can be achieved.

Incidentally, in the embodiment above, while a delivery portion which passes liquid immersion area 14 between wafer stages WST1 and WST2 was configured by eaves sections 23a and 23b (or eaves section 23c (and stepped portion 23d)), the delivery portion does not have to be shaped like the eaves section as long as wafer stage WST1 and wafer stage WST2 can maintain the state opposing each other by a predetermined distance (by a distance which can prevent wafer stage WST1 from coming into contact with wafer stage WST2 and reflection mirror 27f from coming into contact with reflection mirror 27e) by being engaged with each other, and the immersion area can move over the upper surface.

Further, in the embodiment above, wafer stages WST1 and WST2 were driven independently along the XY plane by a planar motor, with the movement path of wafer stages WST1 and WST2 given as a premise. However, the planar motor does not necessarily have to be used, and a linear motor may also be used depending on the movement path.

Further, in the embodiment above, eaves sections 23a and 23b which become engaged with each other (or eaves section 23c and stepped portion 23d which become engaged with each other) were to be arranged on the −Y side end of a surface on the side facing wafer stages WST1 and WST2 at the time of scrum of wafer stage WST1 and WST2. This was employed so as to make the eaves sections correspond to the movement path of wafer stages WST1 and WST2 at the time of scrum as shown in FIGS. 5 and 10 and the like. Accordingly, in the case the movement path of wafer stages WST1 and WST2 are different at the time of the scrum, the arrangement place of eaves section 23a and eaves section 23b (or, eaves section 23c and stepped portion 23d) should be set appropriately, according to the movement path. For example, as long as the delivery portion is arranged on at least one surface of the surfaces arranged on the side where the two wafer stages face each other, the delivery portion is not limited to the −Y end and can be arranged anywhere.

Further, in the embodiment above, while the case has been described where eaves sections 23a and 23b which become engaged with each other (or eaves section 23c and stepped portion 23d which become engaged with each other) were each arranged at one place on a surface on the side where wafer stages WST1 and WST2 face each other at the time of scrum of wafer stage WST1 and WST2, the present invention is not limited to this. However, it is desirable that the delivery portion is arranged at a position that does not substantially obstruct the measurement of the positional information in the Z-axis direction of wafer stage WST1 by XZ interferometers 126 and 127 using reflection mirror 27f (above the non-effective area of the reflection surface of reflection mirror 27f), and a position that does not substantially obstruct the measurement of the positional information in the Z-axis direction of wafer stage WST2 by XZ interferometers 116 and 117 using reflection mirror 27e (above the non-effective area of the reflection surface of reflection mirror 27e).

Figure 12:
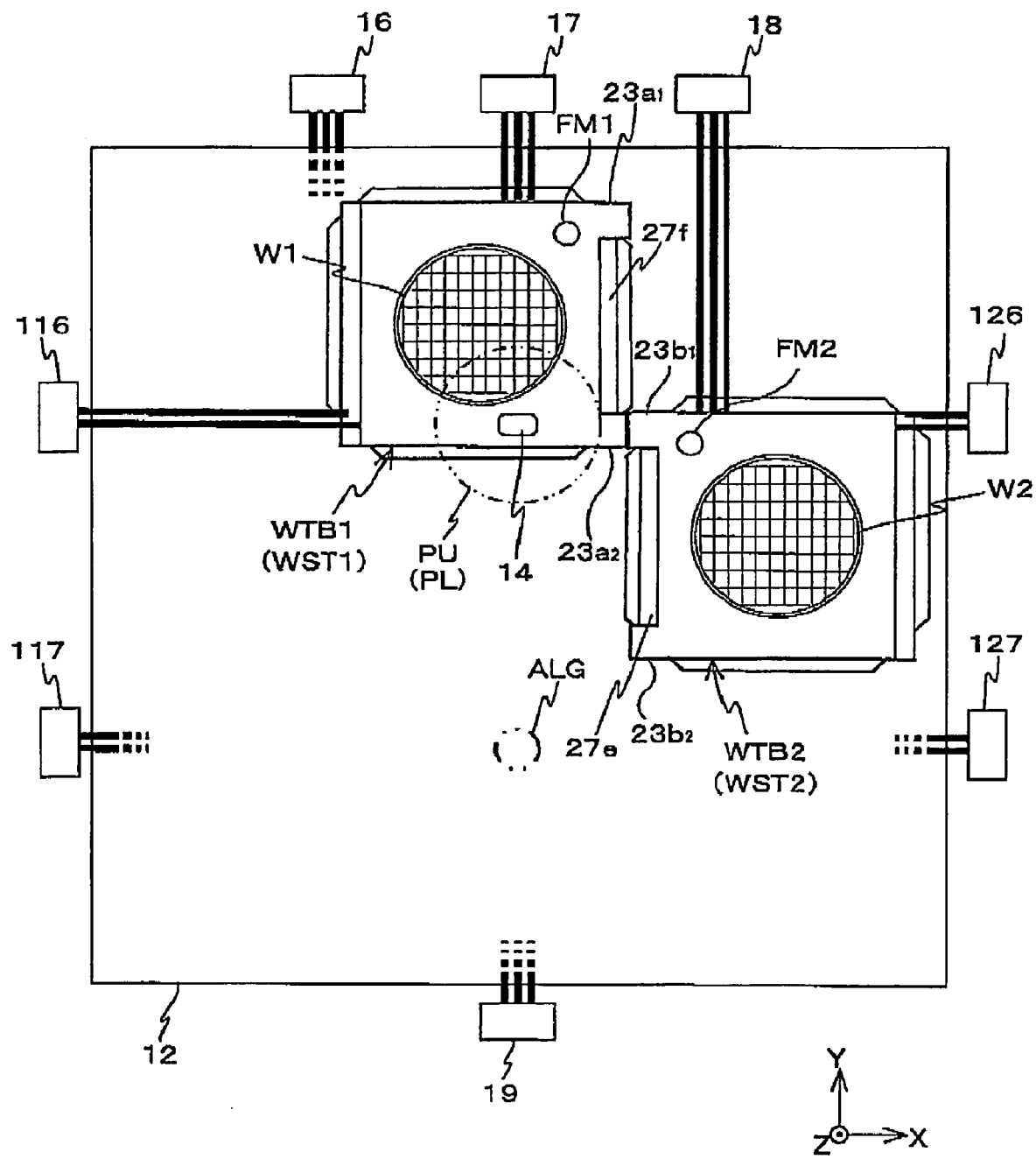
FIG. 12 is a view used to explain an exposure apparatus related to a modified example (No. 1)
Figure 13:
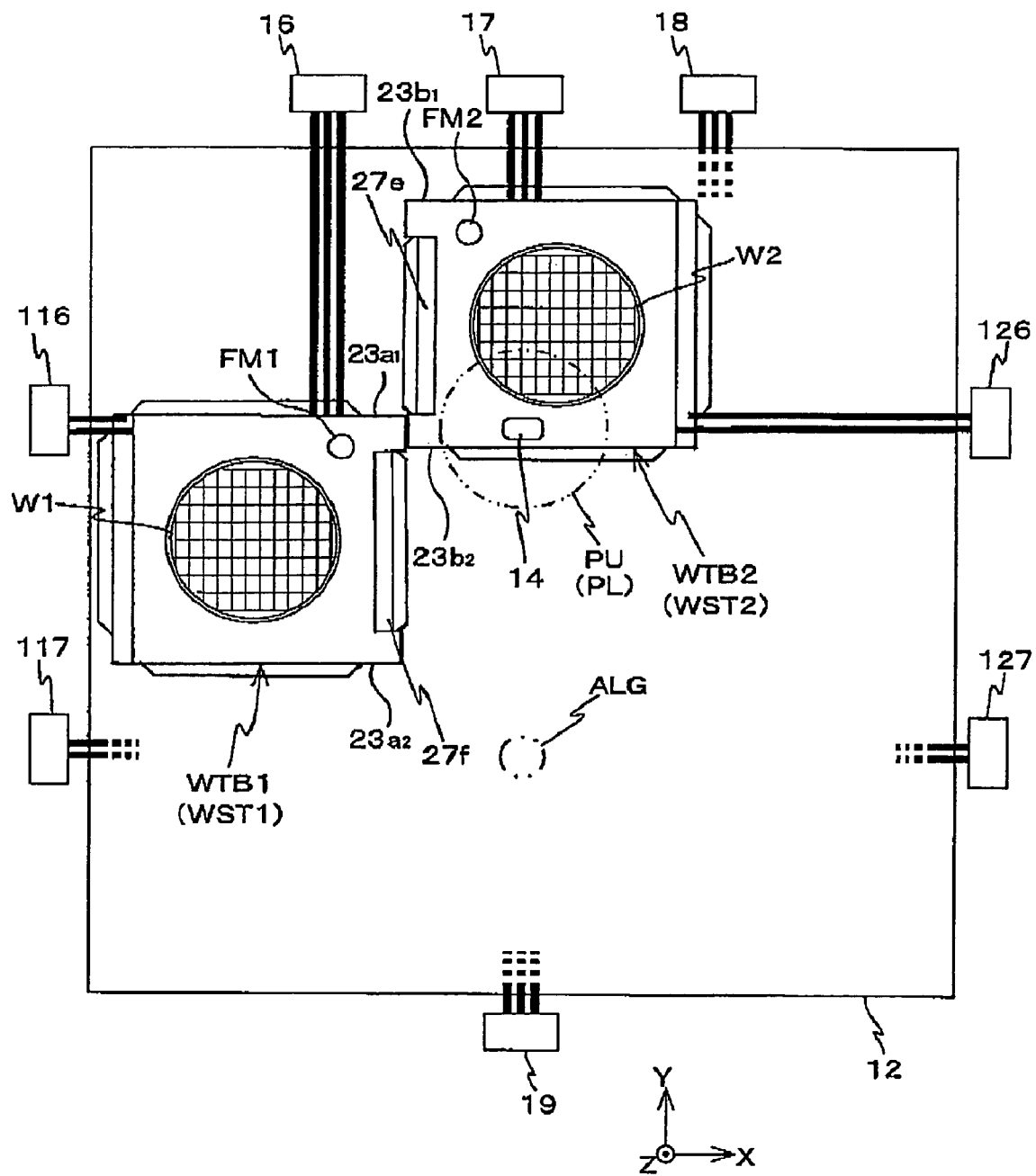
FIG. 13 is a view used to explain an exposure apparatus related to a modified example (No. 2).

FIG. 12 and FIG. 13 shows an exposure apparatus related to a modified example in which eaves sections are arranged at two places each on a surface of wafer stages WST1 and WST2 on the side where the stages face each other at the time of scrum. In the exposure apparatus related to the modified example, on the +X side of wafer stage WST1 (wafer table WTB1) on both ends in the Y-axis direction, eaves sections $23a_1$ and $23a_2$ similar to eaves section 23a previously described are arranged, respectively, as shown in FIG. 12 and FIG. 13. Further, on the −X side of wafer stage WST2 (wafer table WTB2) on both ends in the Y-axis direction, eaves sections 23b1 and 23b2 similar to eaves section 23b previously described are arranged, respectively. The configuration of other sections is similar to the embodiment previously described.

In the exposure apparatus related to the modified example, a so-called complete alternate scan is employed to wafer W1 on wafer stage WST1, in which exposure begins from a shot area located at the upper right (the edge on the +X side and the +Y side) in the vicinity of fiducial mark plate FM1, and the shot area located at the lower right (the edge on the +X side and the −Y side) is exposed last, and also to wafer W2 on wafer stage WST2, exposure begins from a shot area located at the upper left (the edge on the +X side and the +Y side) in the vicinity of fiducial mark plate FM2, and the shot area located at the lower right (the edge on the +X side and the −Y side) is exposed last. FIG. 12 shows a placement of wafer stages WST1 and WST2 just after completion of exposure of wafer W1. Further, FIG. 13 shows a placement of wafer stages WST1 and WST2 just after completion of exposure of wafer W2.

In the exposure apparatus of the modified example, when exposure of wafer W1 is completed, main controller 20 drives both wafer stages WST1 and WST2 in the −X direction from the state shown in FIG. 12, while maintaining the scrum state in which eaves sections $23a_2$ and $23b_1$ are in proximity or in contact similar to the previous description, and delivers liquid immersion area 14 from the area over wafer stage WST1 to wafer stage WST2. Immediately after liquid immersion area 14 has been delivered, main controller 20 begins to move wafer stage WST1 toward the first loading position, and at the same time, drives wafer stage WST2 so as to position fiducial mark plate FM2 just below projection optical system PL, and then after performing reticle alignment, begins exposure of wafer W2 from the shot area located in the vicinity of fiducial mark plate FM2.

Meanwhile, when exposure of wafer W2 is completed, main controller 20 drives both wafer stages WST1 and WST2 in the +X direction from the state shown in FIG. 13, while maintaining the scrum state in which eaves sections $23a_1$ and $23b_2$ are in proximity or in contact similar to the previous description, and delivers liquid immersion area 14 from the area over wafer stage WST2 to wafer stage WST1. Immediately after liquid immersion area 14 has been delivered, main controller 20 begins to move wafer stage WST2 toward the second loading position, and at the same time, drives wafer stage WST1 so as to position fiducial mark plate FM1 just below projection optical system PL, and then after performing reticle alignment, begins exposure of wafer W1 from the shot area located in the vicinity of fiducial mark plate FM1.

As is obvious from the description so far, in the modified example, the placement of eaves sections $23a1$ and $23a2$, and eaves section $23b1$ and $23b2$, or in other words, offset amounts of wafer stages WST1 and WST2 at the time of scrum are decided, so that after exposure of the wafer on one of the wafer stages has been completed, the beginning of exposure of the wafer subject to the next exposure mounted on the other wafer stage including the detection of fiducial marks on the fiducial mark plate can be performed most efficiently, or more specifically, the movement path of the other wafer stage becomes the shortest and the time required also becomes the shortest.

However, in the modified example, because there are the even number of rows of shot areas on wafers W1 and W2, when exposure of a plurality of shot areas on wafers W1 and W2 is performed by the complete alternate scan, the exposure results in wafer stages WST1 and WST2 being located at substantially the same X position at the beginning of exposure and at the end of exposure when focusing attention on the position in the X-axis direction. More specifically, in the case exposure was performed starting from a shot area on the +X side, exposure is completed at a shot area on the +X side, whereas in the case exposure was performed starting from a shot area on the −X side, exposure is completed at a shot area on the −X side.

Meanwhile, in the case the odd number of rows of shot areas on wafers W1 and W2 exist, when the complete alternate scan is employed, exposure is completed at a shot area on the −X side when exposure starts from a shot area on the +X side, whereas exposure is completed at a shot area on the +X side when exposure starts from a shot area on the −X side. As described, in the case the exposure sequence of the shot areas of wafers W1 and W2 is different from the modified example above including the case when the odd number of rows of shot areas on wafers W1 and W2 exist, the placement of the delivery portion such as the eaves section, and when further necessary, the placement of the fiducial mark on the wafer stage can be decided so that the beginning of exposure of the wafer subject to the next exposure can be performed most efficiently including the detection of fiducial marks on the fiducial mark plate according to the exposure sequence. Incidentally, in the description, the scrum which allows the exposure of the wafer subject to the next exposure to be performed in the most efficient manner as described above is also referred to as a most efficient scrum.

In the exposure apparatus related to the embodiment and the modified example described above, while the case has been described where eaves sections are arranged above the non-effective areas of the reflection surfaces of reflection mirrors 27e and 27f, reflection mirrors 27e and 27f may be arranged at positions only where the delivery portion (eaves section 23a and 23b in the embodiment) is not arranged above, on at least one of the surface on the +X side of wafer stage WST1 and the surface on the −X side of wafer stage WST2.

Incidentally, in the exposure apparatus related to the embodiment and the modified example described above, the length of the eaves sections in the X-axis direction was set so that reflection mirror 27f of wafer stage WST1 and reflection mirror 27e of wafer stage WST2 do not come into contact with each other, and the eaves sections were placed at positions where they do not interfere with the measurement using reflection mirrors 27e and 27f, given that reflection mirrors 27e and 27f are arranged. However, the Z position of wafer stages WST1 and WST2 can be measured using measurement devices besides the Z interferometer, and in such a case, reflection mirrors 27e and 27f are not arranged. However, even in such a case, a situation can be considered where a part of the mechanism section protrudes outside from the side surface of wafer stages WST1 and WST2 in the X-axis direction more than the other sections. In such a case, it is desirable that the size of the delivery portion is set approximately to a length in which the protruding sections do not come into contact with a part of the other stage.

Incidentally, in the embodiment and the modified example above, given that the surface on the +X side of wafer stage WST1 faces the surface on the −X side of wafer stage WST2, eaves sections 23a and 23b which become engaged with each other were arranged only on these surfaces. However, besides such an arrangement, when the −X side edge surface of wafer stage WST1 and the +X side edge surface of wafer stage WST2 can be arranged facing each other, it is a matter of course that eaves sections that engage with each other can also be arranged on these surfaces, and the two wafer stages can move into proximity or come into contact via the eaves sections.

Incidentally, in the embodiment and the modified example above, the case has been described where a protruding section such as a fixed eaves section is arranged at wafer stages WST1 and WST2, however, the protruding section does not have to be fixed but may be movable. In this case, for example, an arrangement is possible in which the protruding section is in a nearly-horizontal state only at the time of scrum of both wafer stages WST1 and WST2, and besides the time of scrum, that is, when not used, the protruding section is folded.

Further, in the embodiment and the modified example above, the width of the eaves section in the Y-axis direction was set slightly larger than the liquid immersion area, but the width is not limited thereto, and the width of the eaves section in the Y-axis direction can also be set further larger.

Further, in the embodiment and the modified example above, the case has been described where the two wafer stages WST1 and WST2 are driven in the X-axis direction while maintaining their scrum state on the delivery of the liquid immersion area or the like, however, such direction is not limited to the X-axis direction, and the two wafer stages in the scrum state can also be driven in the Y-axis direction. With such arrangement, a time until the beginning of exposure to a wafer to be exposed next that is held on a wafer stage to which the liquid immersion area was passed after the scrum can be shortened even if only slightly, compared with the case when the two wafer stages WST1 and WST2 are driven only in the X-axis direction while maintaining the scrum state.

Incidentally, in the description so far, the case has been described where a protruding section such as an eaves section is formed on at least one side in the X-axis direction of at least one of wafer stages WST1 and WST2. However, a scrum state with a positional shift (an offset) of both stages in the Y-axis direction such as the state described in, for example, the modified example above, can be employed between two wafer stages that do not have a protruding section such as the eaves section. In this case, the offset amount at the time of the scrum state can be set to be the most efficient scrum similar to the modified example. Or, for example, in the case where there is a component (hereinafter referred to as a projection) on the side surface of one of the wafer stage WST1 on the +X side in the vicinity of the +Y side end and a recessed section which can house the component above inside is formed on the side surface of the other wafer stage WST2 on the −X side in the vicinity of the −Y side end, the offset at the time of the scrum state can be decided so that the projection and the recessed section face each other. In such a case, the liquid immersion area can be moved back and forth in the area over wafer stages WST1 and WST2, while preventing the projection from coming into contact with wafer stage WST2 and causing damage.

Further, in the embodiment above, while the case has been described where the position of wafer stages WST1 and WST2 at the time of exposure and the time of alignment is measured using interferometer system 118, instead of using interferometer system 118 or in addition to the system, an encoder system having a configuration in which a grid section (a Y scale and an X scale) is arranged on the wafer table (wafer stage) and a Y head and an X head are placed external to the wafer stage facing the grid section, such as the one disclosed in, for example, U.S. Patent Application Publication No. 2008/0088843, or an encoder system having a configuration in which an encoder head is arranged on the wafer stage, and a grid section (for example, a two-dimensional grid or a linear grid section having a two-dimensional placement) is placed external to the wafer stage facing the encoder head, as disclosed in, for example, U.S. Patent Application Publication No. 2006/0227309, can be employed.

Incidentally, in the embodiment above, while the lower surface of nozzle unit 32 and the lower end surface of the tip optical element of projection optical system PL were substantially-flush surfaces, as well as this, for example, the lower surface of nozzle unit 32 can be placed nearer to the image plane (more specifically, to the wafer) of projection optical system PL than the outgoing surface of the tip optical element. That is, the configuration of local liquid immersion device 8 is not limited to the configuration described above, and the configurations which are described in, for example, EP Patent Application Publication No. 1420298, U.S. Patent Application Publication 2006/0231206, U.S. Patent Application Publication 2005/0280791, and U.S. Pat. No. 6,952,253 and the like can also be used. Further, as disclosed in, for example, U.S. Patent Application Publication No. 2005/0248856, the optical path on the object plane side of the tip optical element can also be filled with liquid, in addition to the optical path on the image plane side of the tip optical element. Furthermore, a thin film that is lyophilic and/or has dissolution preventing function may also be formed on the partial surface (including at least a contact surface with liquid) or the entire surface of the tip optical element. Incidentally, quartz has a high affinity for liquid, and also needs no dissolution preventing film, while in the case of fluorite, at least a dissolution preventing film is preferably formed.

Incidentally, in the embodiment above, pure water (water) was used as the liquid, however, it is a matter of course that the present invention is not limited to this. As the liquid, a chemically stable liquid that has high transmittance to illumination light IL and is safe to use, such as a fluorine-containing inert liquid can be used. As the fluorine-containing inert liquid, for example, Fluorinert (the brand name of 3M United States) can be used. The fluorine-containing inert liquid is also excellent from the point of cooling effect. Further, as the liquid, liquid which has a refractive index higher than pure water (a refractive index is around 1.44), for example, liquid having a refractive index equal to or higher than 1.5 can be used. As this type of liquid, for example, a predetermined liquid having C—H binding or O—H binding such as isopropanol having a refractive index of about 1.50, glycerol (glycerin) having a refractive index of about 1.61, a predetermined liquid (organic solvent) such as hexane, heptane or decane, or decalin (decahydronaphthalene) having a refractive index of about 1.60, or the like can be cited. Alternatively, a liquid obtained by mixing arbitrary two or more of these liquids may be used, or a liquid obtained by adding (mixing) at least one of these liquids to (with) pure water may be used. Alternatively, as the liquid, a liquid obtained by adding (mixing) base or acid such as $H^+$, $Cs^+$, $K^+$, $Cl^-$, $SO_4^{2-}$, or $PO_4^{2-}$ to (with) pure water can be used. Moreover, a liquid obtained by adding (mixing) particles of Al oxide or the like to (with) pure water can be used. These liquids can transmit ArF excimer laser light. Further, as the liquid, liquid, which has a small absorption coefficient of light, is less temperature-dependent, and is stable to a projection optical system (tip optical member) and/or a photosensitive agent (or a protection film (top coat film), an antireflection film, or the like) coated on the surface of a wafer, is preferable. Further, in the case an $F_2$ laser is used as the light source, fomblin oil can be selected. Further, as the liquid, a liquid having a higher refractive index to illumination light IL than that of pure water, for example, a refractive index of around 1.6 to 1.8 may be used. As the liquid, supercritical fluid can also be used. Further, the tip optical element of projection optical system PL may be formed by quartz (silica), or single-crystal materials of fluoride compound such as calcium fluoride (fluorite), barium fluoride, strontium fluoride, lithium fluoride, and sodium fluoride, or may be formed by materials having a higher refractive index than that of quartz or fluorite (e.g. equal to or higher than 1.6). As the materials having a refractive index equal to or higher than 1.6, for example, sapphire, germanium dioxide, or the like disclosed in the pamphlet of International Publication No. 2005/059617, or kalium chloride (having a refractive index of about 1.75) or the like disclosed in the pamphlet of International Publication No. 2005/059618 can be used.

Further, in the embodiment above, the recovered liquid may be reused, and in this case, a filter that removes impurities from the recovered liquid is preferably arranged in a liquid recovery device, a recovery pipe or the like.

Further, in the embodiment above, the case has been described where the present invention is applied to a scanning exposure apparatus by a step-and-scan method or the like. However, the present invention is not limited to this, but may also be applied to a static exposure apparatus such as a stepper. Further, the present invention can also be applied to a reduction projection exposure apparatus by a step-and-stitch method that synthesizes a shot area and a shot area, an exposure apparatus by a proximity method, a mirror projection aligner, or the like.

Further, the magnification of the projection optical system in the exposure apparatus of the embodiment above is not only a reduction system, but also may be either an equal magnifying system or a magnifying system, and projection optical system PL is not only a dioptric system, but also may be either a catoptric system or a catodioptric system, and in addition, the projected image may be either an inverted image or an upright image. Further, the illumination area and exposure area described above are to have a rectangular shape. However, the shape is not limited to rectangular, and can also be circular arc, trapezoidal, parallelogram or the like.

Incidentally, the light source of the exposure apparatus in the embodiment above is not limited to the ArF excimer laser, but a pulse laser light source such as a KrF excimer laser (output wavelength: 248 nm), an $F_2$ laser (output wavelength: 157 nm), or an extra-high pressure mercury lamp that generates an emission line such as a g-line (wavelength: 436 nm) or an i-line (wavelength: 365 nm) can also be used. Further, a harmonic wave generating unit of a YAG laser or the like can also be used. Besides the sources above, as is disclosed in, for example, U.S. Pat. No. 7,023,610 description, a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytteribium), and by converting the wavelength into ultraviolet light using a nonlinear optical crystal, can also be used.

Further, in the embodiment above, a transmissive type mask (reticle) is used, which is a transmissive substrate on which a predetermined light shielding pattern (or a phase pattern or a light attenuation pattern) is formed. Instead of this reticle, however, as is disclosed in, for example, U.S. Pat. No. 6,778,257 description, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used.

Further, for example, the present invention can also be applied to an exposure apparatus (lithography system) that forms line-and-space patterns on a wafer by forming interference fringes on the wafer.

Moreover, as disclosed in, for example, U.S. Pat. No. 6,611,316, the present invention can also be applied to an exposure apparatus that synthesizes two reticle patterns via a projection optical system and almost simultaneously performs double exposure of one shot area by one scanning exposure.

Incidentally, an object on which a pattern is to be formed (an object subject to exposure to which an energy beam is irradiated) in the embodiment above is not limited to a wafer, but may be other objects such as a glass plate, a ceramic substrate, a film member, or a mask blank.

The use of the exposure apparatus is not limited only to the exposure apparatus for manufacturing semiconductor devices, but the present invention can also be widely applied, for example, to an exposure apparatus for transferring a liquid crystal display device pattern onto a rectangular glass plate, and an exposure apparatus for producing organic ELs, thin-film magnetic heads, imaging devices (such as CCDs), micromachines, DNA chips, and the like.

Further, the present invention can be applied not only to an exposure apparatus for producing microdevices such as semiconductor devices, but can also be applied to an exposure apparatus that transfers a circuit pattern onto a glass plate or silicon wafer to produce a mask or reticle used in a light exposure apparatus, an EUV exposure apparatus, an X-ray exposure apparatus, an electron-beam exposure apparatus, and the like.

Electronic devices such as semiconductor devices are manufactured through the steps of; a step where the function/performance design of the device is performed, a step where a reticle based on the design step is manufactured, a step where a wafer is manufactured from silicon materials, a lithography step where the pattern of a mask (the reticle) is transferred onto the wafer by the exposure apparatus (pattern formation apparatus) and the exposure method in the embodiment previously described, a development step where the wafer that has been exposed is developed, an etching step where an exposed member of an area other than the area where the resist remains is removed by etching, a resist removing step where the resist that is no longer necessary when etching has been completed is removed, a device assembly step (including a dicing process, a bonding process, the package process), inspection steps and the like. In this case, in the lithography step, because the device pattern is formed on the wafer by executing the exposure method previously described using the exposure apparatus of the embodiment, a highly integrated device can be produced with good productivity.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. An exposure apparatus that exposes an object with an energy beam via an optical system and a liquid, the apparatus comprising:

a detection system that is placed in a second area different from a first area where the optical system is placed, and detects positional information of the object;

a base member of which surface is placed substantially parallel to a predetermined plane in a predetermined area that includes the first area and the second area;

a first movable body and a second movable body each of which is placed on the base member and has a mounting area for the object on an upper surface;

a planar motor system of which stator is arranged on the base member and movers are arranged on the first movable body and the second movable body, and which moves each of the first movable body and the second movable body substantially along the predetermined plane in the predetermined area from one of the first and the second areas to the other of the first and the second areas; and a delivery portion arranged in at least one of the first and the second movable bodies and capable of holding a liquid immersion area to which the liquid is supplied under the optical system; wherein the planar motor system moves the first and the second movable bodies in a second direction, which intersects a first direction in the predetermined plane, with respect to the liquid immersion area, with at least a part of the delivery portion being positioned between the upper surfaces of the movable bodies, the upper surfaces having edges placed facing each other substantially parallel to the first direction in the predetermined plane, and with one of the movable bodies being placed under the optical system, so that the movement causes the other of the movable bodies to be placed under the optical system in place of the one of the movable bodies and the immersion area to be transferred from the one of the movable bodies to the other via the delivery portion while being maintained under the optical system, and a positional relation between the first and the second movable bodies in the first direction during the movement with respect to the liquid immersion area is different for a replacement of the first movable body by the second movable body and for a replacement of the second movable body by the first movable body.

2. The exposure apparatus according to claim 1, wherein the delivery portion is placed so that an upper surface of the delivery portion is at substantially a same position as the upper surfaces of the first and the second movable bodies in a third direction orthogonal to the predetermined plane during the movement of the first and the second movable bodies with respect to the liquid immersion area.

3. The exposure apparatus according to claim 1, wherein the first and the second movable bodies are moved in the second direction with respect to the liquid immersion area, with the positional relation of the movable bodies substantially being maintained.

4. The exposure apparatus according to claim 3, the apparatus further comprising:
a first reflection surface tilted with respect to the predetermined plane and arranged on at least one of sides of the first movable body, the sides facing a direction perpendicular to the edge in the predetermined plane;
a second reflection surface tilted with respect to the predetermined plane and arranged on at least one of sides of the second movable body, the sides facing a direction perpendicular to the edge in the predetermined plane; and
a measurement system which irradiates measurement beams on the first and the second reflection surfaces and measures positional information of the first and the second movable bodies in a third direction orthogonal to the predetermined plane.

5. The exposure apparatus according to claim 4, wherein the measurement system includes an interferometer which measures the positional information of the first and the second movable bodies in the third direction by irradiating measurement beams on the first and the second reflection surfaces, while a state where the at least a part of the delivery portion is positioned between the upper surfaces is maintained.

6. The exposure apparatus according to claim 4, wherein the delivery portion is arranged at a position on the at least one of the sides facing the direction perpendicular to the edge in the predetermined plane of at least one of the first and the second movable bodies, the position not substantially obstructing the measurement of positional information of the first and the second movable bodies in the third direction by the measurement system.

7. The exposure apparatus according to claim 4, wherein the first and the second reflection surfaces are arranged at a position where the delivery portion is not arranged on the at least one of the sides facing the direction perpendicular to the edge in the predetermined plane of at least one of the first and the second movable bodies.

8. The exposure apparatus according to claim 4, the apparatus further comprising:
a third and a fourth reflection surfaces which are arranged on surfaces of the first and the second movable bodies, respectively, the surfaces being other than surfaces on sides facing each other of the movable bodies in a state where the at least a part of the delivery portion is positioned between the upper surfaces, wherein
the measurement system includes interferometers which irradiate measurement beams on the third and the fourth reflection surfaces, respectively, and measure positions of the first and the second movable bodies based on reflected lights of the respective measurement beams from the third and the fourth reflection surfaces.

9. The exposure apparatus according to claim 1, wherein when two delivery portions are arranged, the delivery portions protrude from end surfaces of the first movable body and the second movable body, respectively, in a state where the delivery portions can face each other, the end surfaces being in directions the movable bodies face each other in a state where the at least a part of the delivery portion is positioned between the upper surfaces.

10. The exposure apparatus according to claim 9, wherein on a tip of each of the two delivery portions which can face each other, an engaging portion is formed which engages with each other and can also form a surface appearing to be completely flat in the engaged state.

11. The exposure apparatus according to claim 1, wherein the positional relation between the first and the second movable bodies in the first direction is decided so that a state where the at least a part of the delivery portion is positioned between the upper surfaces enables the most efficient starting of exposure to a subsequent object subject to exposure.

12. The exposure apparatus according to claim 1, wherein the positional relation between the first and the second movable bodies in the first direction is decided so that the one of the movable bodies and the other of the movable bodies do not face each other except for where the at least a part of the delivery portion is positioned between the upper surfaces.

13. The exposure apparatus according to claim 1, wherein the first movable body and the second movable body are shifted from each other in the direction parallel to the edge, to opposite sides for the replacement of the first movable body by the second movable body and for the replacement of the second movable body by the first movable body.

14. The exposure apparatus according to claim 1, wherein in an exposure operation where a plurality of objects are exposed using the first and the second movable bodies alternately, the liquid continues to be held between the optical system and one of the movable bodies located in the first area.

15. The exposure apparatus according to claim 1, further comprising:
a restraining member which is arranged in at least one of the first movable body and the second movable body, and which restrains leakage of the liquid from a clearance between the delivery portion arranged in one of the movable bodies and the other of the movable bodies during the movement of the first and the second movable bodies with respect to the liquid immersion area.

16. The exposure apparatus according to claim 15, wherein the restraining member includes at least one of a seal member and a water-repellent coating.

17. The exposure apparatus according to claim 1, wherein the delivery portion is an eaves section arranged protruding outside at the edge of the upper surface of the at least one of the movable bodies.

18. The exposure apparatus according to claim 1, wherein the first area and the second area are at different positions in a predetermined direction,
to the first movable body, a cable is connected from one side in a direction intersecting the predetermined direction, and
to the second movable body, a cable is connected from the other side in the direction intersecting the predetermined direction.

19. The exposure apparatus according to claim 1, wherein, a placement of the delivery portion arranged in the at least one of the first and the second movable bodies is decided, depending on whether a plurality of divided areas subject to exposure on the object held by the at least one of the movable bodies are in an even number of rows or in an odd number of rows.

20. The exposure apparatus according to claim 1, wherein the detection system includes a mark detection system which detects a mark on the object mounted on each of the first movable body and the second movable body.

21. The exposure apparatus according to claim 1, wherein the other of the movable bodies is moved relative to the one of the movable bodies which is placed under the optical system so that the two movable bodies are placed shifting in the first direction to make the edges of the movable bodies face each other at a part and that the two movable bodies come close to each other in the second direction, and the delivery portion is positioned at the part where the edges face each other during the movement of the first and the second movable bodies with respect to the liquid immersion area.

22. The exposure apparatus according to claim 21, wherein the other of the movable bodies is moved from the second area to the first area prior to the movement of the first and the second movable bodies with respect to the liquid immersion area, and in the first area, moved relative to the one of the movable bodies subsequent to exposure to the object mounted on the one of the movable bodies.

23. The exposure apparatus according to claim 22, wherein the other of the movable bodies is moved from the second area to the first area subsequent to the detection of positional information of the object mounted on the other of the movable bodies by the detection system, and a detection operation to the object by the detection system is performed in parallel with an exposure operation to the object held by the one of the movable bodies.

24. The exposure apparatus according to claim 1, wherein the positional relation of the first and the second movable bodies is decided so that the two movable bodies are shifted from each other in the first direction, to opposite sides for the replacement of the first movable body by the second movable body and the replacement of the second movable body by the first movable body.

25. The exposure apparatus according claim 1, wherein the delivery portion is placed so that a surface of the delivery portion is substantially flush with the upper surfaces of the first and the second movable bodies during the movement of the first and the second movable bodies with respect to the liquid immersion area.

26. The exposure apparatus according to claim 1, wherein the edges facing each other during the movement of the first and the second movable bodies with respect to the liquid immersion area are the same for the replacement of the first movable body by the second movable body and for the replacement of the second movable body by the first movable body.

27. The exposure apparatus according to claim 1, wherein the delivery portion has a first delivery portion and a second delivery portion arranged in the first movable body and the second movable body, respectively, and
one of the first and the second delivery portions is used in the replacement of the first movable body by the second movable body, and the other of the first and the second delivery portions is used in the replacement of the second movable body by the first movable body.

28. The exposure apparatus according to claim 1, wherein a scanning exposure is performed to the object,
to the first movable body, a cable is connected from one side in a direction intersecting a predetermined direction along which the movable body is moved in the scanning exposure, and
to the second movable body, a cable is connected from the other side in the direction intersecting the predetermined direction.

29. The exposure apparatus according to claim 28, wherein the first and the second areas are at different positions in the predetermined direction.

30. The exposure apparatus according to claim 1, wherein a scanning exposure is performed to the object, and
the first and the second areas are at different positions in a predetermined direction along which the object is moved in the scanning exposure.

31. The exposure apparatus according to claim 1, wherein the first movable body and the second movable body are moved from the first area to the second area via different paths.

32. The exposure apparatus according to claim 1, wherein the first movable body and the second movable body are moved from the second area to the first area via different paths.

33. The exposure apparatus according to claim 32, wherein the first movable body and the second movable body are moved from the first area to the second area via different paths.

34. The exposure apparatus according to claim 1, wherein the first area and the second area are at different positions in a predetermined direction, and
in the movement from the first area to the second area, the first movable body moves along a path in one end side in a direction intersecting the predetermined direction of the predetermined area, and the second movable body moves along a path in the other end side in the direction intersecting the predetermined direction of the predetermined area.

35. The exposure apparatus according to claim 34, wherein to the first movable body, a cable is connected from one side in the direction intersecting the predetermined direction, and
to the second movable body, a cable is connected from the other side in the direction intersecting the predetermined direction.

36. The exposure apparatus according to claim 35, wherein
a scanning exposure is performed to the object, and
each of the first and the second movable bodies is moved in the predetermined direction in the scanning exposure.

37. The exposure apparatus according to claim 1, wherein
the first area and the second area are at different positions in the first direction, and
in the movement from the first area to the second area, the first movable body moves along a path in one end side in the second direction of the predetermined area, and the second movable body moves along a path in the other end side in the second direction of the predetermined area.

38. The exposure apparatus according to claim 1, wherein
to the first movable body, a cable is connected from one side in the second direction, and
to the second movable body, a cable is connected from the other side in the second direction.

39. The exposure apparatus according to claim 1, wherein
a scanning exposure is performed to the object, and
in the scanning exposure, each of the first and the second movable bodies is moved in the first direction.

40. The exposure apparatus according to claim 1, wherein
the planar motor system is a moving magnet type of planar motor system with magnet units arranged in each of the first and the second movable bodies.

41. An exposure method in which an object is exposed with an energy beam via an optical system and a liquid, the method comprising:
moving each of a first movable body and a second movable body from one of a first area where the optical system is placed and a second area where a detection system to detect positional information of the object is placed and which is different from the first area, to the other of the first area and the second area via a planar motor system of which stator is arranged on a base member and of which movers are arranged on the first and the second movable bodies, the first and the second movable bodies being placed on the base member arranged with its surface substantially parallel to a predetermined plane in a predetermined area which includes the first area and the second area, and each of the movable bodies having a mounting area for the object on an upper surface; and
moving the first and the second movable bodies in a second direction, which intersects a first direction in the predetermined plane, with respect to a liquid immersion area to which the liquid is supplied under the optical system, via the planar motor system, with at least a part of a delivery portion that is arranged in at least one of the movable bodies being positioned between the upper surfaces of the movable bodies, the upper surfaces having edges placed facing each other substantially parallel to the first direction in the predetermined plane, and with one of the movable bodies being placed under the optical system, so that the movement causes the other of the movable bodies to be placed under the optical system in place of the one of the movable bodies and the immersion area to be transferred from the one of the movable bodies to the other via the delivery portion while being maintained under the optical system, wherein
a positional relation between the first and the second movable bodies in the first direction during the movement with respect to the liquid immersion area is different for a replacement of the first movable body by the second movable body and for a replacement of the second movable body by the first movable body.

42. The exposure method according to claim 41, wherein
the delivery portion is placed so that an upper surface of the delivery portion is at substantially a same position as the upper surfaces of the first and the second movable bodies in a third direction orthogonal to the predetermined plane during the movement of the first and the second movable bodies with respect to the liquid immersion area.

43. The exposure method according to claim 41, wherein
the first and the second movable bodies are moved in the second direction with respect to the liquid immersion area, with the positional relation of the movable bodies substantially being maintained.

44. The exposure method according to claim 43, wherein
a first reflection surface tilted with respect to the predetermined plane is arranged on at least one of sides of the first movable body, the sides facing a direction perpendicular to the edge in the predetermined plane, and a second reflection surface tilted with respect to the predetermined plane is arranged on at least one of sides of the second movable body, the sides facing a direction perpendicular to the edge in the predetermined direction, whereby
the first and the second reflection surfaces are irradiated with measurement beams and positional information of the first and the second movable bodies in the third direction orthogonal to the predetermined plane is measured.

45. The exposure method according to claim 44, wherein
an interferometer which irradiates the first and the second reflection surfaces with measurement beams is used for the measurement of the positional information of the first and the second movable bodies in the third direction while a state where the at least a part of the delivery portion is positioned between the upper surfaces is maintained.

46. The exposure method according to claim 44, wherein
the delivery portion is arranged at a position on the at least one of the sides facing the direction perpendicular to the edge in the predetermined plane of at least one of the first and the second movable bodies, the position not substantially obstructing the measurement of positional information of the first and the second movable bodies in the third direction.

47. The exposure method according to claim 44, wherein
the first and the second reflection surfaces are arranged at a position where the delivery portion is not arranged on the at least one of the sides facing the direction perpendicular to the edge in the predetermined plane of at least one of the first and the second movable bodies.

48. The exposure method according to claim 44, the method further comprising:
irradiating a third and a fourth reflection surfaces with measurement beams, respectively, and measuring positions of the first and the second movable bodies based on reflected lights of the respective measurement beams from the third and the fourth reflection surfaces, the third and the fourth reflection surfaces being arranged on surfaces of the first and the second movable bodies, respectively, the surfaces being other than surfaces on sides facing each other of the movable bodies in a state where the at least a part of the delivery portion is positioned between the upper surfaces.

49. The exposure method according to claim 41, wherein
when two delivery portions are arranged, the delivery portions protrude from end surfaces of the first movable body and the second movable body, respectively, in a state where the delivery portions can face each other, the end surfaces being in directions the movable bodies face each other in a state where the at least a part of the delivery portion is positioned between the upper surfaces.

50. The exposure method according to claim 49, wherein on a tip of each of the two delivery portions which can face each other, an engaging portion is formed which engages with each other and can also form a surface appearing to completely flat in the engaged state.

51. The exposure method according to claim 41, wherein the positional relation between the first and the second movable bodies in the first direction is decided so that a state where the at least a part of the deliver portion is positioned between the upper surfaces enables the most efficient starting of exposure to a subsequent object subject to exposure.

52. The exposure method according to claim 41, wherein the positional relation between the first and the second movable bodies in the first direction is decided so that the one of the movable bodies and the other of the movable bodies do not face each other except for where the at least a part of the delivery portion is positioned between the upper surfaces.

53. The exposure method according to claim 41, wherein the first movable body and the second movable body are shifted from each other, in the direction parallel to the edge, to opposite sides for the replacement of the first movable body by the second movable body and for the replacement of the second movable body by the first movable body.

54. The exposure method according to claim 41, wherein in an exposure operation where a plurality of objects are exposed using the first and the second movable bodies alternately, the liquid continues to be held between the optical system and one of the movable bodies located in the first area.

55. The exposure method according to claim 41, wherein in at least one of the first movable body and the second movable body, a restraining member is arranged that restrains leakage of the liquid from a clearance between the delivery portion arranged in one of the movable bodies and the other of the movable bodies during the movement of the first and the second movable bodies with respect to the liquid immersion area.

56. The exposure method according to claim 55, wherein the restraining member includes at least one of a seal member and a water-repellent coating.

57. The exposure method according to claim 41, wherein the delivery portion is an eaves section arranged protruding outside at edge of the upper surface of the at least one of the movable bodies.

58. The exposure method according to claim 41, wherein the first area and the second area are at different positions in a predetermined direction,
to the first movable body, a cable is connected from one side in a direction intersecting the predetermined direction, and
to the second movable body, a cable is connected from the other side in the direction intersecting the predetermined direction.

59. The exposure method according to claim 41, wherein a placement of the delivery portion arranged in the at least one of the first and the second movable bodies is decided, depending on whether a plurality of divided areas subject to exposure on the object held by the at least one of the movable bodies are in an even number of rows or in an odd number of rows.

60. The exposure method according to claim 41, wherein the detection system includes a mark detection system which detects a mark on the object mounted on each of the first movable body and the second movable body.

61. The exposure method according to claim 41, wherein the other of the movable bodies is moved relative to the one of the movable bodies which is placed under the optical system so that the two movable bodies are placed shifting in the first direction to make the edges of the movable bodies face each other at a part and that the two movable bodies come close to each other in the second direction, and the delivery portion is positioned at the part where the edges face each other during the movement of the first and the second movable bodies with respect to the liquid immersion area.

62. The exposure method according to claim 61, wherein the other of the movable bodies is moved from the second area to the first area prior to the movement of the first and the second movable bodies with respect to the liquid immersion area, and in the first area, moved relative to the one of the movable bodies subsequent to exposure to the object mounted on the one of the movable bodies.

63. The exposure method according to claim 62, wherein the other of the movable bodies is moved from the second area to the first area subsequent to the detection of positional information of the object mounted on the other of the movable bodies by the detection system, and a detection operation to the object by the detection system is performed in parallel with an exposure operation to the object held by the one of the movable bodies.

64. The exposure method according to claim 41, wherein the positional relation of the first and the second movable bodies is decided so that the two movable bodies are shifted from each other in the first direction, to opposite sides for the replacement of the first movable body by the second movable body and the replacement of the second movable body by the first movable body.

65. The exposure method according to claim 41, wherein the delivery portion is placed so that a surface of the delivery portion is substantially flush with the upper surfaces of the first and the second movable bodies during the movement of the first and the second movable bodies with respect to the liquid immersion area.

66. The exposure method according to claim 41, wherein the edges facing each other during the movement of the first and the second movable body with respect to the liquid immersion area are the same for the replacement of the first movable body by the second movable body and for the replacement of the second movable body by the first movable body.

67. The exposure method according to claim 41, wherein the delivery portion has a first delivery portion and a second delivery portion respectively arranged in the first movable body and the second movable body, and
one of the first and the second delivery portions is used in the replacement of the first movable body by the second movable body, and the other of the first and the second delivery portions is used in the replacement of the second movable body by the first movable body.

68. The exposure method according to claim 41, wherein a scanning exposure is performed to the object,
to the first movable body, a cable is connected from one side in a direction intersecting a predetermined direction along which the movable body is moved in the scanning exposure, and to the second movable body, a cable is connected from the other side in the direction intersecting the predetermined direction.

69. The exposure method according to claim 68, wherein the first and the second areas are at different positions in the predetermined direction.

70. The exposure method according to claim 41, wherein a scanning exposure is performed to the object, and
the first and the second areas are at different positions in a predetermined direction along which the object is moved in the scanning exposure.

71. The exposure method according to claim 41, wherein the first movable body and the second movable body are moved from the first area to the second area via different paths.

72. The exposure method according to claim 41, wherein the first movable body and the second movable body are moved from the second area to the first area via different paths.

73. The exposure method according to claim 72, wherein the first movable body and the second movable body are moved from the first area to the second area via different paths.

74. The exposure method according to claim 41, wherein the first area and the second area are at different positions in a predetermined direction,
in the movement from the first area to the second area, the first movable body moves along a path in one end side in a direction intersecting the predetermined direction of the predetermined area, and the second movable body moves along a path in the other end side in the direction intersecting the predetermined direction of the predetermined area.

75. The exposure method according to claim 74, wherein to the first movable body, a cable is connected from one side in the direction intersecting the predetermined direction, and
to the second movable body, a cable is connected from the other side in the direction intersecting the predetermined direction.

76. The exposure method according to claim 75, wherein a scanning exposure is performed to the object, and
each of the first and the second movable bodies is moved in the predetermined direction in the scanning exposure.

77. The exposure method according to claim 41, wherein the first area and the second area are at different positions in the first direction, and
in the movement from the first area to the second area, the first movable body moves along a path in one end side in the second direction of the predetermined area, and the second movable body moves along a path in the other end side in the second direction of the predetermined area.

78. The exposure method according to claim 41, wherein to the first movable body, a cable is connected from one side in the second direction, and
to the second movable body, a cable is connected from the other side in the second direction.

79. The exposure method according to claim 41, wherein a scanning exposure is performed to the object, and
in the scanning exposure, each of the first and the second movable bodies is moved in the first direction.

80. The exposure method according to claim 41, wherein the planar motor system is a moving magnet type of planar motor system with magnet units arranged in each of the first and the second movable bodies.

81. A device manufacturing method, comprising:
exposing the object by the exposure method according to claim 41; and
developing the object which has been exposed.

* * * * *